United States Patent [19]
Komarek et al.

[11] Patent Number: 6,002,618
[45] Date of Patent: Dec. 14, 1999

[54] NMOS INPUT RECEIVER CIRCUIT

[75] Inventors: James A. Komarek, Newport Beach; Clarence W. Padgett, Westminster; Scott B. Tanner, Irvine, all of Calif.; Shin-ichi Kojima, Amagasaki, Japan; Jack L. Minney; Motohiro Oishi, both of Irvine, Calif.; Keiji Fukumura; H. Nakanishi, both of Hyougo, Japan

[73] Assignee: Creative Integrated Systems, Santa Ana, Calif.

[21] Appl. No.: 09/190,040

[22] Filed: Nov. 11, 1998

Related U.S. Application Data

[62] Division of application No. 08/927,773, Sep. 11, 1997, Pat. No. 5,870,346, which is a division of application No. 08/764,574, Dec. 13, 1996, abandoned, which is a division of application No. 08/563,212, Nov. 27, 1995, Pat. No. 5,608,687, which is a division of application No. 08/290,549, Aug. 15, 1994, Pat. No. 5,487,038.

[51] Int. Cl.[6] .............................. G11C 16/04; G11C 7/00; G11C 8/00

[52] U.S. Cl. .................. 365/189.5; 365/226; 365/230.08

[58] Field of Search ......................... 365/189.05, 230.08, 365/226; 326/71

[56] References Cited

U.S. PATENT DOCUMENTS

| | | | |
|---|---|---|---|
| 4,406,957 | 9/1983 | Atherton | 326/71 |
| 4,490,633 | 12/1984 | Noufer et al. | 326/71 |
| 4,593,212 | 6/1986 | Svager | 326/71 |
| 4,612,461 | 9/1986 | Sood | 326/71 |
| 4,672,243 | 6/1987 | Kirsch | 326/71 |
| 4,786,830 | 11/1988 | Foss | 326/71 |
| 4,791,323 | 12/1988 | Austin | 326/71 |
| 4,794,283 | 12/1988 | Allen et al. | 326/71 |
| 5,079,439 | 1/1992 | Wanlass | 326/71 |
| 5,144,167 | 9/1992 | McClintock | 326/71 |
| 5,151,620 | 9/1992 | Lin | 326/71 |
| 5,151,622 | 9/1992 | Thrower et al. | 326/71 |
| 5,304,867 | 4/1994 | Morris | 326/71 |

*Primary Examiner*—Trong Phan
*Attorney, Agent, or Firm*—Daniels L. Dawes

[57] ABSTRACT

An input receiver circuit in a read-only memory is provided with a feedback to control hysteresis. A second stage and an additional output is added to the receiver. Switching circuit noise from inside of the read-only memory is isolated by the added state and outputs, and cannot be fed back into the receiver circuit to affect the detection of the TTL voltage levels. Use of wide and long FET sizes minimizes the manufacture related variations in the input receiver switching levels.

5 Claims, 23 Drawing Sheets

NMOS INPUT RECEIVER CIRCUIT

RELATED APPLICATIONS

The present application is a divisional of application Ser. No. 08/927,773, Sep. 11, 1997 now U.S. Pat. No. 5,870,346, which in turn was a divisional of application Ser. No. 08/764,574, which was filed on Dec. 13, 1996 and is now abandoned, which still in turn was a divisional of application Ser. No. 08/563,212 filed on Nov. 27, 1995 which issued as U.S. Pat. No. 5,608,687. U.S. Pat. No. 5,608,687 (1997) and a divisional of application Ser. No. 08/290,549 filed on Aug. 15, 1994 which issued as U.S. Pat. No. 5,487,038.

BACKGROUND OF THE INVENTION

1. Field of the Invention

The invention relates to improvements to circuitry used in very large scale integrated CMOS memory circuits.

2. Description of the Prior Art

An Improved Output Driver to Control Switching Noise

In U.S. Pat. No. 5,241,497 (1993), entitled "VLSI Memory with Increased Memory Access Speed, Increased Memory Cell Density and Decreased Parasitic Capacitance", a continuation of which is copending and incorporated herein by reference, an output driver was described in connection with FIGS. 14, 15, 29 and 31 in which the switching speed of the output driver was controlled with a bias circuit that compared an RC delay and gate delay. The assumption of the control assumed that the delay of the read cycle of the read-only memory (ROM) varied substantially. This variation arises due to manufacturing variables, temperature changes, and operating voltage variations. The output drivers in the ROM are designed to be as fast as a switching noise will allow for the slowest read cycle of the ROM. Therefore, for the faster read cycles, the output driver switching speed is slower than the read cycle speed and thus the switching noise is reduced.

The ROM is designed to perform with a maximum access time. In the case of ROMs which are designed to have fast read cycles, the switching speed of the output drivers may be delayed without penalty as long as the total read cycle delay is less than the maximum access time.

What is needed however is an output driver which incorporates the advantages described above, but which can be implemented in a CMOS design. The output driver switching speed should also be controlled for both rising and falling edges. In the above-mentioned NMOS version, the output driver switching speed was controlled only for the falling edge of the driver. It would further be advantageous to use the voltage precharge signal to control the output driver switching speed. Independent control of normal and slow switching speeds would be desirable. Reduction of power supply and ground voltage noise would be of benefit A Bias Generator for Control of Output Buffer Switching Noise.

The above-referenced copending application, now issued as U.S. Pat. No. 5,241,497, includes in connection with the description of FIGS. 25–30, the description of a circuit using both RC and gate delays to generate a bias control signal for controlling the switching speed of an output driver. However, the design described therein is adaptable only for NMOS designs, has a relatively fixed RC delay time, is somewhat subject to process variations in the chip, and has a circuit speed performance which in some scenarios can be improved.

Memory Core Supply Voltage and Bit Line Control Voltage for a CMOS ROM

Read-only memory circuits use a precharge voltage, VPC, throughout the circuit to, among other things, precharge the bit lines in the memory. The precharged voltage, VPC, is a low supply voltage supplied in the read-only memory by a power supply circuit. For example, in the above co-pending application, now issued as U.S. Pat. 5,241,497 the voltage VPC is generated by an NMOS circuit and has an output which varies slightly as the high supply voltage, VDD, increases. The circuit employs feedback amplifiers to reduce the recovery time when negative voltage transients occur on its output. However, the NMOS portion of the ROM is not always being accessed and therefore has a power-down mode. During the power-down mode, the ROM must operate under reduced power, typically at a maximum standby power level.

Therefore, what is needed is a circuit for generating the precharged voltage, VPC, used in a read-only memory which is adaptable to CMOS design, which is capable of powering down during the standby operation or to a lower level specified for maximum standby power supply current, but which does not sacrifice its ability to provide appropriate operating supply voltages which must be maintained even during standby operation An Improved AMOS Input Receiver Circuit In a read-only memory, the memory is accessed through an address input Switching noises from inside the read-only memory can feedback into the input receiver circuit and affect a detection of the TTL voltage input levels. This noise could change a switching level of the input receiver to result in a false address input This would occur, for example, in the case of very slow moving and noisy inputs when the noise would be falsely detected as an address transition and a new read cycle erroneously started.

What is needed is a design for an improved input receiver for use in a read-only memory circuit which is immune from feedback noise from the read-only memory circuit.

Output Driver Control for ROM and RAM Devices

Read only memories and random access memories typically have output drivers through which the data is buffered and driven off-chip onto a bus. Typically, such output drivers are tristated, having a high logic level low logic level and a floating or open voltage so that the connected bus lines can be set at other logic levels by other devices on the bus. However, depending upon the output driver timing, buffering problems can arise as a result of system noise, power dissipation in the output driver and in system data bus contention conflicts.

What is need is an improved output driver float timing control which is more immune to system noise, lends itself to lower power dissipation in the output driver and avoids system data bus contention conflicts.

Dynamic ROM Design for Read Cycle Interrupts

In memories which include dynamic circuits, latches, clocked logic gates and address transition detection circuits, it is possible that address skew errors can arise in which a-malfunction occurs when a read cycle interrupts a memory cycle in an attempt to establish a new read cycle. In very simple prior art memories, address skew errors very rarely arise. However in more sophisticated designs having a large number of dynamic circuits, latches, address transition circuits, clocks and clocked logic gates, as is increasingly the case with larger memories, the probability of address skew becoming a significant problem substantially increases.

Therefore, what is needed is a design for controlling the timing of clocks in an interrupted cycle and a design for circuits in a memory to properly respond to these clocks in order to avoid address skew errors.

ROM Code Mask Programmable CMOS Latch

The NMOS ROM mode control circuit shown in FIG. 23 is a prior art circuit devised by the assignee of the applicant and is characterized by using two ROM core FETs, each FET denoted by reference numeral 546 and 548. The logic level of the output node 544, MDOE, is programmed high or low by controlling the threshold voltage implants for FETs 546 or 548 within circuit 540. This control provides an easy means of changing among various types of circuit operating modes in a ROM memory during the conventional encoding step in the manufacture of a VLSI memory.

The circuit of FIG. 23 also provides a means of limiting the source to drain voltage across core FETs 546 and 548. This is accomplished by a cascade connection of FET 550 and the use of a low voltage signal, GVPC, on the gate of FET 550. By this means, the voltage at node 552 is less than 3 volts. GVPC is an internal voltage supply which in the illustrated embodiment is about 3.5 volts.

What is needed is a circuit to replace the function of that shown in FIG. 23, but which is adapted for CMOS processing. The circuit should have very low power dissipation after the power is applied and should be able to latch to the proper logic state with small differences in the threshold voltages. After the latching is completed, the data in the latch should be immune to power bus transients. The output of the latch should be at the circuit logic levels and connectable directly to logic gates within the circuit.

BRIEF SUMMARY OF THE INVENTION

An Improved Output Driver to Control Switching Noise

The invention is an improvement in a read-only memory having data outputs driven by corresponding output drivers. The improvement is in the output driver and comprises a CMOS output circuit for generating an output signal in response to a complementary pair of gate input signals, NQIP and NQIN. A first control circuit varies the rate at which the gate signals, NQIP and NQIN, are applied to the CMOS output circuit in response to a control signal, SLOW. The control signal SLOW, has at least two states, one state for determining a first switching speed of the CMOS output circuit and a second state for determining a second and substantially slower speed of the CMOS output circuit. As a result, switching speed of the output driver is controlled to reduce switching noise.

The improvement further comprises a second control circuit for varying the switching speed of the CMOS output circuit in response to variations in manufacturing parameters, power supply voltage variations and temperature variations. The second control circuit is controlled by a single voltage precharge signal VPC.

The output generated by the CMOS output circuit has a rising and falling edge and the first control circuit varies switching speed of both the rising and falling edges so that switching noise on both high and ground sides of the voltage supply in the read only memory is reduced.

The first control circuit comprises a plurality of FETs. Each of the FETs has a device width. Control of the rising and falling edges are independently controlled by selectively varying the width of the FETs.

The switching speed is controlled by a predetermined number of FETs. The predetermined number of FETs are a subset of FETs included within the first control circuit. The remaining FETs of the first control circuit, not included within the subset, each has a width not dependent upon switching speed of the rising and falling edges of the output.

The invention is also characterized as an improvement in a method for switching a circuit having a maximum access time limitation. The method comprises the steps of generating a control signal, SLOW, in response to an actually determined response of the circuit The signal SLOW has a first value when the circuit response is normal and signal SLOW has a second value when the circuit response is slow. Gate drive signals, NQIP, and NQIN, are generated in response to the value of the control signal, SLOW. The rate of generation of the gate drive signals, NQIP, NQIN, are determined according to the value of SLOW. The gate drive signals, NQIP and NQIN, are applied to the gates of a CMOS output circuit. An output signal is generated from the CMOS output signal at a rate dependent upon the value of the signal SLOW. As a result, switching noise within the circuit is reduced.

The method further comprises the steps of providing a signal in the circuit indicative of manufacturing parameters, voltage variations and temperature variations, and modifying generation of at least one of the gate drive signals, NQIP, and NQIN, in response to the circuit condition signal VPC.

The improvement further comprises the step of modifying the rate of generation of the gate drive signals, NQIP and NQIN, by selectively varying the width of selected ones of FETs used to generate the gate drive signals. The selected ones of the FETs are used to control the rate of increase and decrease of the gate drive signals, NQIP and NQIN.

A Bias Generator for Control of Output Buffer Switching Noise

The invention is a bias generator for generating a control signal indicative of the relative speed of RC delays as compared to gate delays within a read-only memory. The bias generator comprises an RC delay circuit for generating an RC delayed signal a gate delay circuit for generating a gate delay control signal, and a comparator circuit for comparing the RC delayed control signal and the gate delayed control signal to generate the control signal, SLOW. As a result, circuitry within the read-only memory may be controlled by the control signal, SLOW, according to operating characteristics of the read-only memory as representative by RC delay and gate delay within the read-only memory.

The bias generator further comprises a latch circuit for storing the control signal SLOW as soon as the comparator circuit generates the control signal SLOW. The RC delay circuit comprises a circuit for quickly precharging the RC delay circuit. The gate delay circuit comprises a circuit for quickly resetting gates within the gate delay circuit.

The invention is also characterized as an improvement in a method for generating a bias control signal in a read-only memory circuit. The bias control signal is indicative of whether the read-only memory circuit is characterized by RC delays or gate delays. The method comprises the steps of quickly precharging an RC delay circuit, quickly resetting a gate delay circuit, generating an RC delay control signal indicative of the RC delays encountered in the read-only memory circuit, generating a gate delay control signal indicative of gate delays typically encountered in the read-only memory circuit, comparing the gate delay circuit and RC delay circuit to determine which delay circuit is first generated, and generating a control signal, SLOW, indicative of whether the read-only memory circuit is characterized by RC delays or gate delays. As a result, circuitry within the read-only memory may be coupled to the control signal, SLOW, and appropriately configured to operate according to the nature of operation of the read-only memory circuit.

The improvement further comprising the step of storing the control signal, SLOW, during at least a portion of each memory address cycle.

The gate delay circuit is comprised of a series circuit of coupled gates and the step of quickly resetting the gate delay circuit comprises the step of resetting a plurality of subsequences of the serially connected gates. Each of the subsequences is simultaneously reset in parallel.

The RC delay circuit comprises a resistive circuit portion coupled to a capacitive circuit portion. The resistive circuit portion has an input and output terminal and the step of quickly precharging RC delay circuit comprises the step of applying a precharging signal simultaneously to the input and output terminals of the resistive portion.

The step of comparing comprises the steps of generating a transmission window to a receiving latch wherein the RC delay control signal is active and setting or resetting the latch according to whether the gate delay control signal is active during the transmission window or afterwards.

Memory Core Supply Voltage and Bit Line Control Voltage for a CMOS ROM

The invention is a circuit for generating an internal supply voltage for use in a read-only memory comprising a VPC circuit for generating a voltage precharge signal VPC for precharging memory core of the ROM after a read cycle and for maintaining the voltage VPC approximately at a predetermined level notwithstanding changes in the high voltage supply VDD within the ROM. A power down circuit is coupled to the VPC circuit and reduces power consumption within the VPC circuit while maintaining the VPC power supply level at approximately the predetermined level. As a result, the VPC voltage level is available as a reliable supply voltage even during power down of the read-only memory.

The circuit further comprises an MLC circuit for generating an internal control voltage at least one threshold voltage above the voltage level of the VPC signal and which tracks VPC voltage level for varying operating conditions. The MLC circuit generates an MLC signal at a voltage level approximately one NFET threshold voltage above the VPC voltage level while simultaneously tracking variations in the high voltage power supply level, VDD.

The read-only memory is comprised of FET devices and the VPC circuit tracks changes and threshold voltages of the FETs to generate the VPC signal according to the FET threshold voltage within the read-only memory.

The VPC circuit increases the voltage precharge signal, VPC, in response to increases in the high voltage supply signal, VDD. The VPC circuit comprises a high gain constant current source such that, when a transient load is coupled thereto, reestablishment of the voltage precharge signal VPC, is quickly achieved.

The MLC circuit further comprises a MLC power down circuit to substantially reduce power usage within the MLC circuit during a power down mode while maintaining the MLC signal at approximately the same voltage level as prior to power down.

The invention is also a method for generating a voltage precharged signal in a read-only memory comprising the steps of providing a drive voltage signal VRN, approximately two NFET threshold voltages above ground. The VRN control signal is input into a circuit which generates the precharge voltage signal VPC, so that the voltage precharge signal VPC tracks changes in the NFET threshold voltages within the read-only memory.

The method further comprises the steps of providing a current to a node which tracks variations in the supply voltage VDD, and of inputting the current from the node to a circuit to generate VPC so that VPC increases as the current provided to the node increases and tracks VDD.

The method further comprises the step of providing negative feedback from the circuit generating VPC to the node to limit increases in VPC as VDD increases.

The voltage precharge signal VPC is generated by a source follower and the step of generating the VPC signal through the source follower comprises the step of driving the source follower with high gain constant current source so that when transient loads are coupled to the VPC signal the driving signal to the source follower is rapidly restored to pretransient levels notwithstanding capacitive coupling with the transient through the source follower.

The method further comprises the step of reducing power consumption within the circuit for generating VPC during a power down condition while simultaneously maintaining the voltage precharge signal level at the pre power down level.

The method further comprises the step of generating in response to the VPC signal, and an internal control signal in the ROM, MLC, to track operating and manufacturing variations to maintain a small constant fraction of the discharging current in a bit line within the memory core.

The method further comprises the step of generating the MLC signal to track with the voltage precharge signal VPC.

The method further comprises the steps of reducing power within the circuit for generating the MLC signal while simultaneously maintaining the MLC signal at pre power down voltage levels.

An Improved NMOS Input Receiver Circuit

The invention is an improvement in an input buffer circuit used for detecting TTL voltage levels. The improvement comprises a first inverter to detect a TTL voltage level and a second inverter having an input coupled to an output of the first inverter. The second inverter increases the amplitude and power of an output signal responsive to the TTL voltage detection. A feedback path couples the output of the second inverter to the first inverter to alter hysteresis switching characteristics of the first inverter. A circuit is provided and coupled to the first and second inverters for isolating the feedback loop from switching noise coupled to the first inverter. As a result, TTL voltage detection is achieved by the TTL detection circuit with increased noise immunity without speed degradation or increased power consumption.

The first and second inverters are NMOS inverters having wide and long FET sizes to minimize manufacturing related variations. The switching noise arises from address switching in a memory circuit and the TTL detection circuit is an input address buffer for a read-only memory.

The switching noise is coupled into the input buffer circuit through at least one field effect transistor and the circuit for isolating the feedback loop from switching noise comprises a circuit for decoupling the one field effect transistor from the feedback path.

The circuit for decoupling the one field effect transistor from the feedback path comprises a series circuit of a first and second field effect transistor. The first field effect transistor has a gate coupled to a first stage output of the second inverter. The second field effect transistor has a gate coupled to the input the second inverter. The decoupled one field effect transistor is coupled to an output of the series circuit of the first and second field effect transistors.

The invention is also characterized as an address input buffer circuit in an addressable memory circuit comprises an input of the address input buffer coupled to one of the address signals. An output of the buffer circuit is coupled to the memory. A circuit is provided for establishing a threshold voltage of the input of the buffer circuit when the address signal goes from a low logic level to a high logic level. The threshold voltage is established at a first predetermined level. Another circuit is provided for establishing a second threshold voltage at a second corresponding predetermined level when the address signal at the input goes from a high logic level to a low logic level The second threshold voltage is less than the first threshold voltage so that the threshold voltages of the input of the input buffer circuit operate in a hysteresis loop to render the address input buffer insensitive to noise. Still another circuit is provided for substantially isolating feedback switching noise from the input and from the circuit for establishing the first and second threshold voltages. The switching noise arises within the read-only memory upon the event of an address detection. As a result, immunity of the address input buffer to internal memory noise is increased.

The step of substantially isolating feedback switching noise comprises the step of coupling all sources of switching noise to isolating field effect transistors.

Output Driver Control for ROM and RAM Devices

The invention is a control circuit for controlling an output driver coupled to the data outputs of a memory having address transition detection circuitry. The memory is operable in a standby and an active memory modes in sequential memory cycles comprising: an output enable latch circuit which provides an internal memory of whether the memory was operating in the standby or active mode during a previous memory cycle; and a data latch circuit which provides an internal memory of whether a new read cycle is beginning within the memory. The data latch circuit is reset when an address detection has occurred within the memory. A logic circuit combines an output of the data latch circuit indicative of a memory read cycle with an output of the output enable latch circuit indicative of whether the prior memory cycle was standby or active. The logic circuit generates an output enable signal, OE, coupled to the output drivers of the memory to control float of the output drivers. As a result, smooth transition from old data to new data is obtained and system data bus contention in transitions from standby to active modes is eliminated.

The data latch circuit comprises a circuit for providing a smooth transition from a first read cycle data output to a second read cycle data output.

The output enable latch circuit comprises a circuit for preventing output of old data when operation of the memory is changed from the standby to the active memory mode thereby reducing power dissipation and bus contention from the output drivers.

The memory has internal sense amplifiers and the data latch circuit comprises a circuit for floating the output drivers by controlling the output enable signal coupled to the output drivers during a memory read cycle to thereby prevent bus noise from affecting internal sense amplifier operation within the memory.

The circuit for controlling the output enable signal, OE, generates a delayed sense latch signal, SLCH to ensure that transients caused by unlatching the sense amplifier do not propagate to the output drivers before the output drivers are floated.

The invention is also a method for controlling the float of output drivers of a memory having address transition detection circuitry comprising the steps of providing an internal memory within a memory control circuit for holding the operational mode of the memory during a prior memory cycle. The operational mode can be either a standby or an active mode. An internal memory of when a read cycle of the memory begins and when the address transition detection circuitry detects an address transition is provided. The memory of the previous mode of operation of the memory circuit and status of the current memory read cycle is logically combined to selectively generate an output enable signal to float the output drivers of the memory circuit.

The step of logically combining to selectively generate the output enable signal, OE, combines the contents of the internal memories to generate the output enable signal, OE, to prevent output of old data from the memory circuit when the operational mode of the memory circuit is changed from standby to a read cycle thereby reducing power dissipation and avoiding bus contention.

The step of logically combining comprises the step of logically combining the contents of the internal memories to provide a smooth transition from a first read cycle data output to a second read cycle data output.

The method further comprising the step of generating a delayed sense latch control signal after the output enable signal used to float the output drivers in the middle of a read cycle of the memory circuit to prevent transients caused by unlatching the sense amplifiers from propagating to the output drivers.

Dynamic ROM Design for Read Cycle Interrupts

The invention is a method for clocking the read cycle of a memory to avoid address skew errors. The method comprises the steps of receiving a first sample address control signal, SMPA, indicating an input address change. A primary clock signal, START, is generated in response to receipt of the sample address signal SMPA. The clock signal START having a predetermined time duration The clock signal START, is maintained active for a duration long enough to provide adequate precharge time for the memory given variations in supply voltage, temperature and manufacturing process variation and further to permit adequate discharge time for the address word line in the memory even when driven high in a previous memory cycle so that a precharge phase of the memory is begun A second sample address signal SMPA, is then received. The precharge phase of the memory is continued notwithstanding receipt of the second sample address signal, SMPA, by virtue of setting the START signal high for the predetermined time period after receipt of each of the sample address signals, SMPA. As a result, address skew errors are avoided.

The step of generating the START signal further comprises the step of setting a latch. Secondary memory clock signals are generated in response to setting of the latch. A trigger signal, TRIG, is generated when data within the memory can be read. The START signal has the duration of sufficient length such that the latch remains securely latched even if the second sample address signal SMPA, is received during generation of the TRIG signal indicating that data in the memory is ready for output.

The method further comprises the step of floating data output signals from the memory if the second sample address signal, SMPA, is received during transition of data output signals from the memory from a previous read cycle.

The method further comprises the step of generating a plurality of secondary memory clock signals in response to generation of the START clock signal The secondary memory clock signals are utilized within the memory to prepare the memory to read out an addressed location within the memory.

The step of generating the START signal generates the START signal with a one shot multivibrator circuit. The START signal is generated when an address interrupt occurs early within a memory read cycle. The START signal is restarted by the one shot multivibrator circuit and is used to restart a new memory read cycle without switching the secondary clock signals except for those secondary clocks relating to new address inputs into the memory.

The invention is also characterized as an improvement in a control circuit for generating clocks in a memory having a read cycle comprising a one shot multivibrator for generating a START clock signal which goes active high at the beginning of a new read cycle. A PCOK circuit generates a clock signal, PCOK, for causing the one shot multivibrator to reset the START signal low. The PCOK circuit defines a predetermined duration of the START clock signal The duration is of sufficient magnitude to permit adequate precharging of the memory and adequate discharge time for a word line in the memory core which was selected and was driven high in a previous memory cycle given changes in supply voltage, temperature and manufacture process variations. A secondary clock circuit generates a plurality of secondary clock signals in response to the START signal. Each of the secondary clock signals serves to time a precharge phase of the memory.

The secondary clock circuit comprises a latch circuit for generating one of the secondary clock signals. The latch circuit is set by the START signal and reset by a memory control signal, TRIG, indicative of readiness of data within the memory to be output. The duration of the START signal is sufficiently long to maintain the latch circuit set when a subsequent sample address signal is received, thus generating the START signal notwithstanding simultaneous receipt of the TRIG signal to reset the latch circuit when the subsequent sample address signal is being received.

ROM Code Mask Programmable CMOS Latch

The invention is an improved CMOS latch for interfacing with memory core field effect transistors. The latch comprises a pair of P-channel field effect transistors (PFETs) each having a gate, source and drain. The gates of each of the PFETs are cross coupled to the drain of the other one of the pair of PFETs. The source of one of the PFETs providing an output for the latch. A pair of N-channel field effect transistors (NFETs) are coupled in series with the pair of PFETs. Each of the NFETs has a source, gate and drain. The sources of the NFETs are coupled to the drains of the corresponding PFETs and the gates of the NFETs are coupled together to form an input for the latch. A pair of field effect transistors, defined as core FETs, are provided which are substantially identically to field effect transistors used in the memory. Each of the core FETs has a source, gate and drain and having a predetermined threshold value implanted within the core FET. The input of the latch is coupled to a supply voltage so that upon power-up of the latch a high gain prestored output is provided at the output of the latch.

In one embodiment the gates of the core FETs are each coupled to the input of the latch so that a regenerative positive feedback is realized within the latch to ensure that after latching is completed power dissipation within the latch is reduced to source-to-drain current leakages through at most one of the PFETs and one of the NFETs.

In another embodiment each of the gates of the core FETs are cross coupled to the drains of the NFETs which are coupled in series with the other one of the core FETs so that a positive regenerative feedback is provided within the latch and after latching is completed, power dissipation in the latch is reduced to a negligible value being the source-to-drain leakage current through one of the core FETs and one of the PFETs when the PFET and core FET of interest are turned off.

The input is coupled to a low voltage supply, GVPC, within the memory to reduce subthreshold current and power dissipation in the latch by applying a voltage to the core FETs from the NFETs at approximately one threshold voltage less than the supply voltage, GVPC, and to reduce the source to drain voltage through the core FET.

The latch further comprises a chip enable switching device coupled in series with the sources of the pair of PFETs so that the PFETs are disconnected from the power supply during standby mode as a result, power dissipation is reduced.

The invention is also characterized as a method for providing improved mask programmable latch operation in a memory circuit comprising the steps of providing a CMOS latch with positive regenerative feedback and providing a pair of ROM core FETs substantially identical to FETs used in the memory core. The pair of ROM core FETs are implanted with selective threshold values. A predetermined output is generated from the CMOS latch according to implantations provided in the ROM core FETs so that a memory latch is provided with a mask programmable output having high gain and immune to power bus transients and low power dissipation.

The memory circuit has a power supply and further comprises the step of disconnecting the latch from the power supply during standby mode operation to reduce power dissipation. The latch has an input coupled to the low voltage power supply, and further comprises the step of reducing power dissipation within the latch by reducing subthreshold current flowing through the latch by providing a reduced power supply voltage input to the latch.

The step of generating predetermined output further comprises the step of simultaneously reducing power dissipation within the latch by having the generated output defined within the latch by devices which are turned off when the latch has completely latched so that power dissipation is restricted after complete latching to source to drain leakages through the FET devices.

The invention and its various embodiments may be better visualized by turning to the following drawings wherein like elements are referenced by like numerals.

BRIEF DESCRIPTION OF THE DRAWINGS

An Improved Output Driver to Control Switching Noise

A Bias Generator for Control of Output Buffer Switching Noise.

Figure 4A:
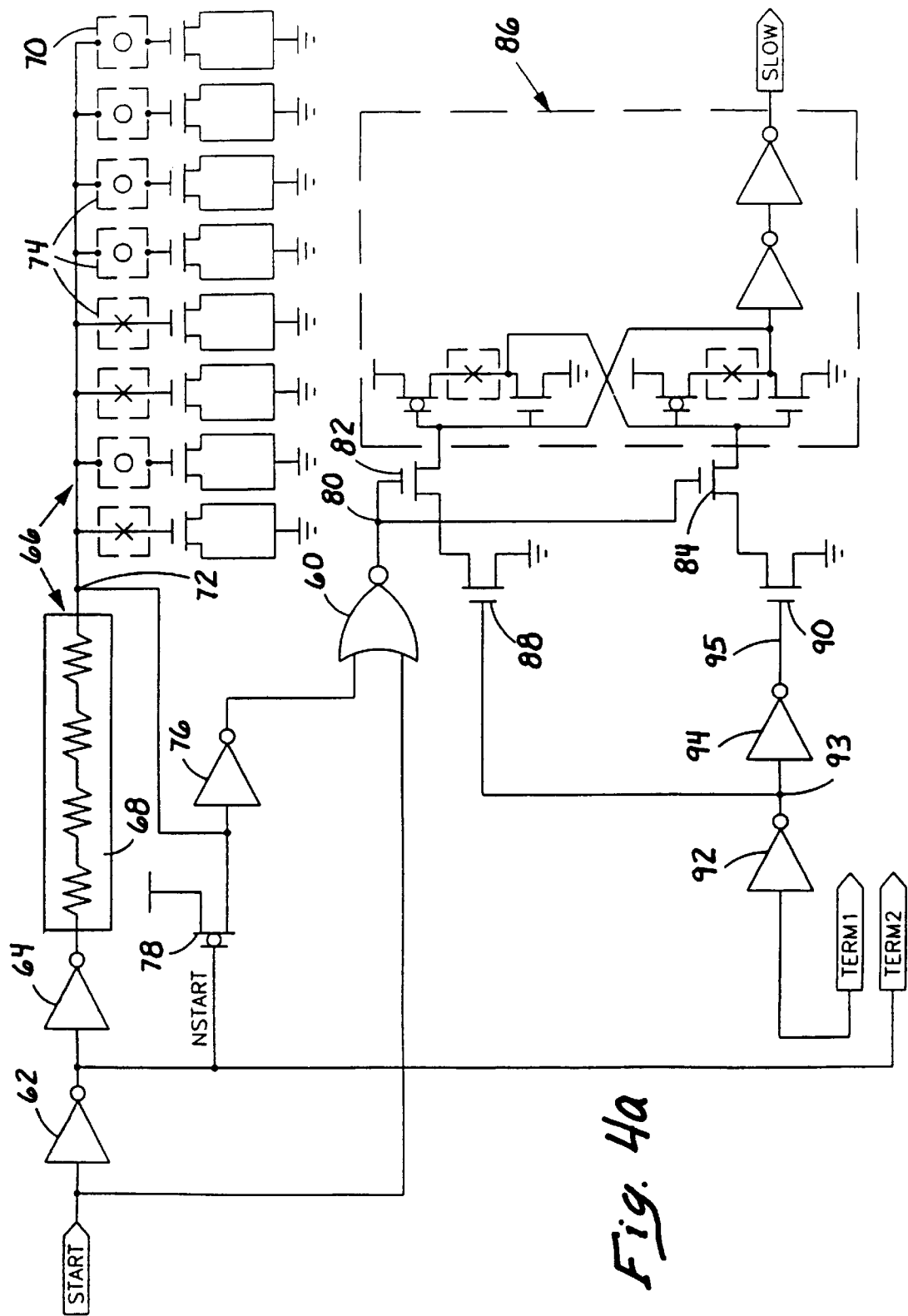
Figure 4B:
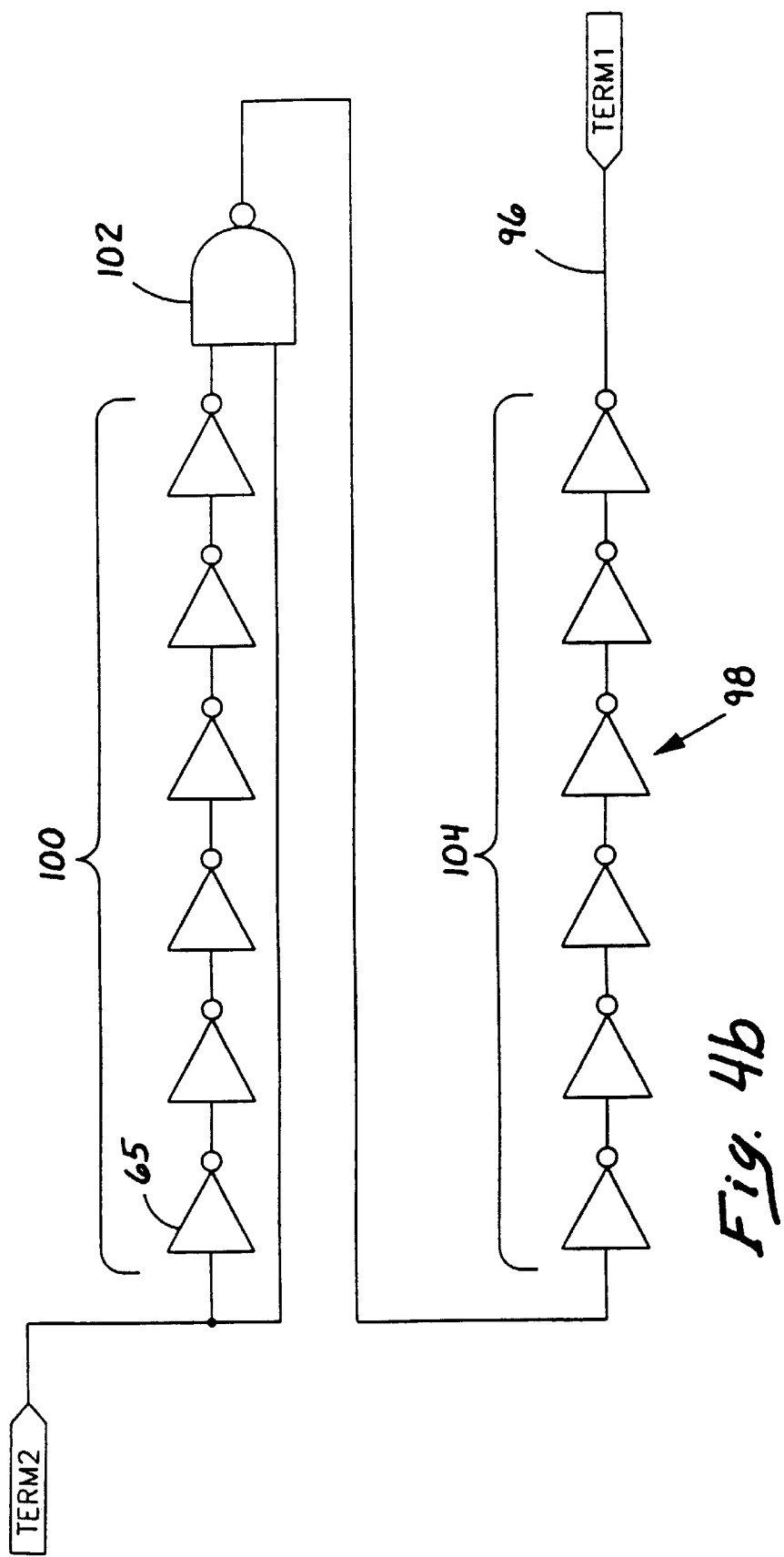

FIGS. 4a–4b is a schematic of the improved bias generation circuit of the invention.

Figure 5:
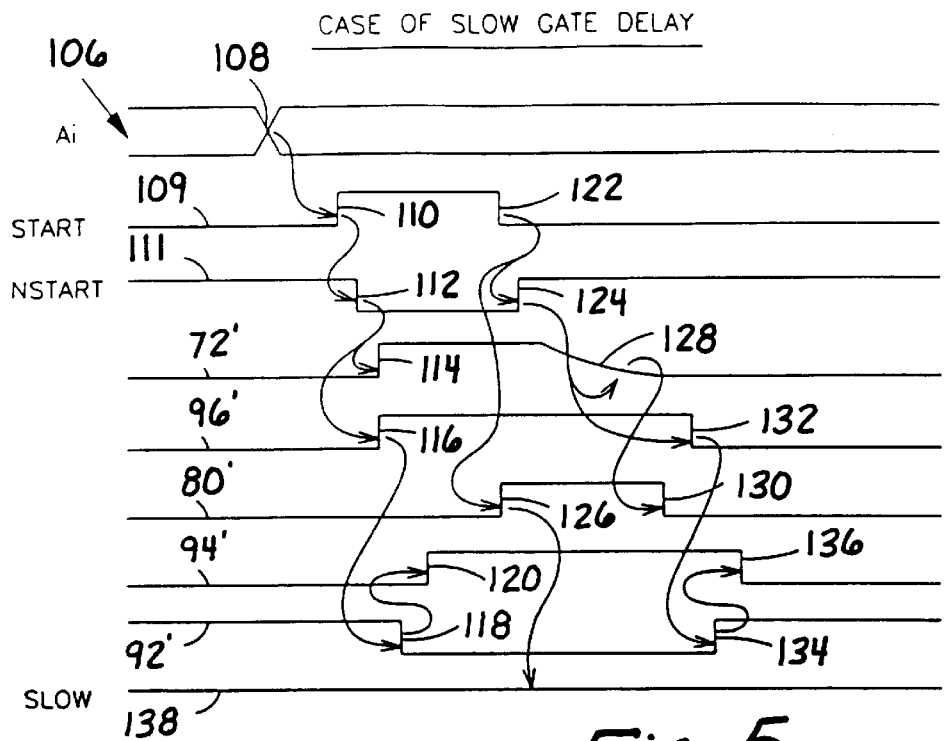

FIG. 5 is a timing diagram of the operation of the circuit of FIGS. 4a–4b shown in the case in which the signal, SLOW, is high indicative of a slow gate delay.

Figure 6:
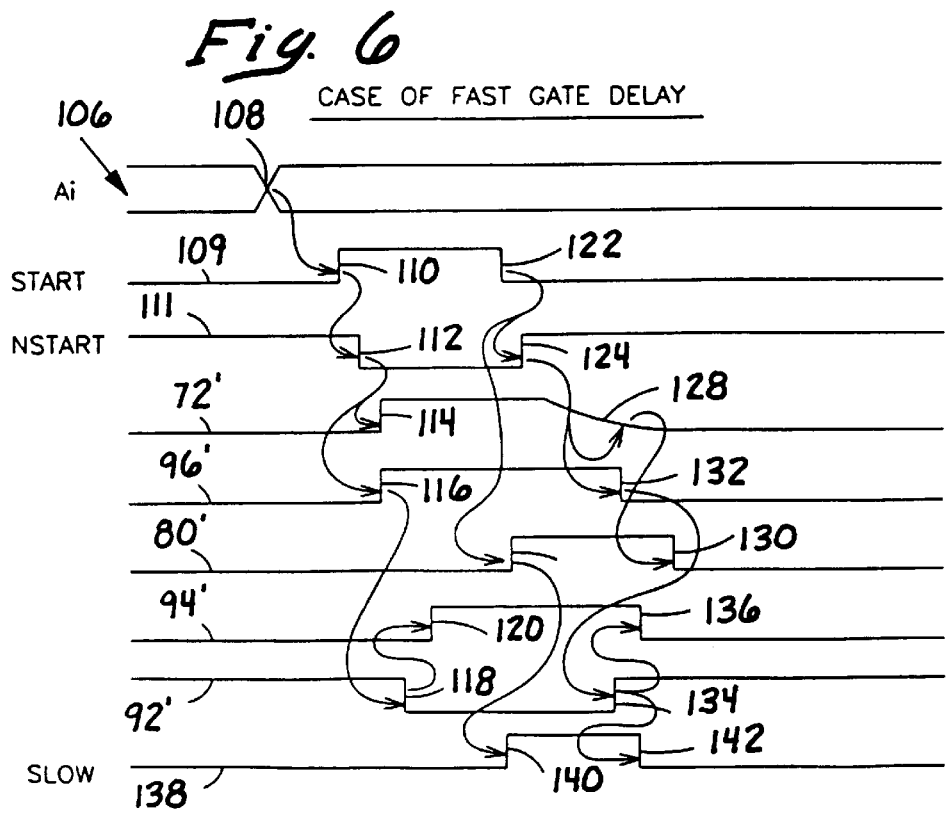

FIG. 6 is timing diagram of the operation of circuit of FIGS. 4a–4b shown in the case where the signal, SLOW, is low indicating a fast gate delay.

Memory Core Supply Voltage and Bit Line Control Voltage for a CMOS ROM

Figure 7:
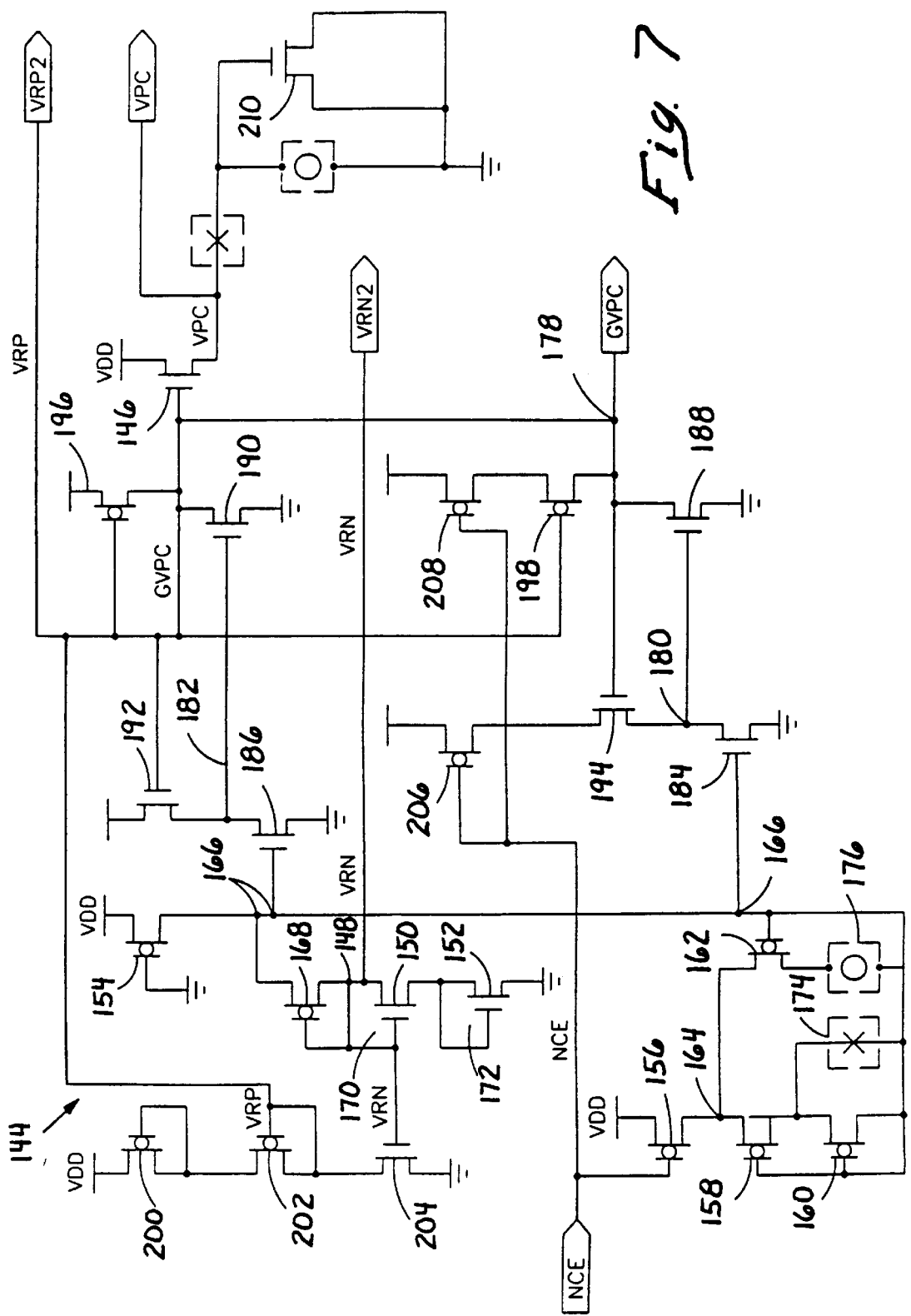

FIG. 7 is a schematic of a circuit for generating a precharged voltage, VPC.

Figure 8:
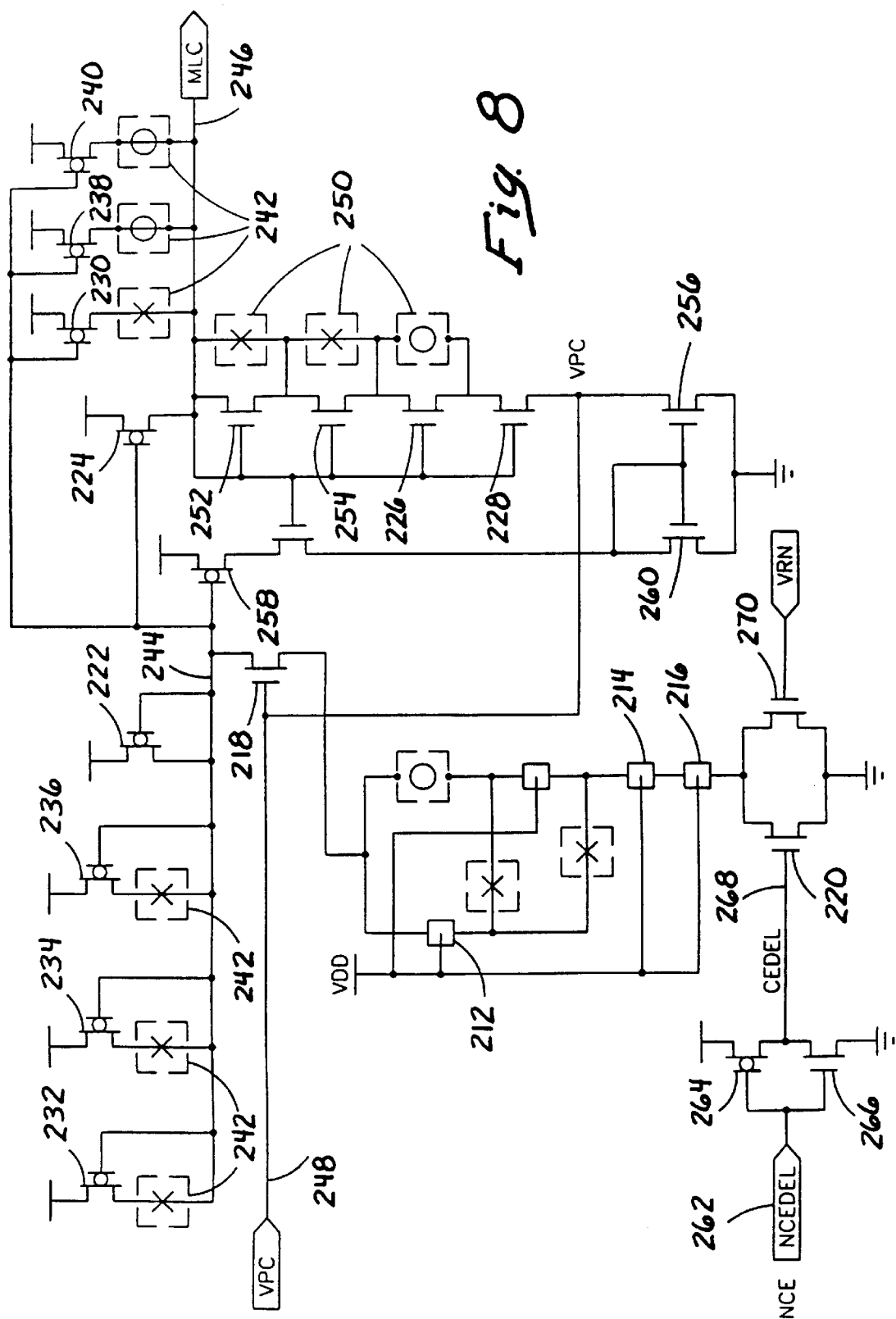

FIG. 8 is a schematic of a circuit for generating an internal control signal, MLC, which must be maintained during power-down standby.

An Improved NMOS Input Receiver Circuit

Figure 9:
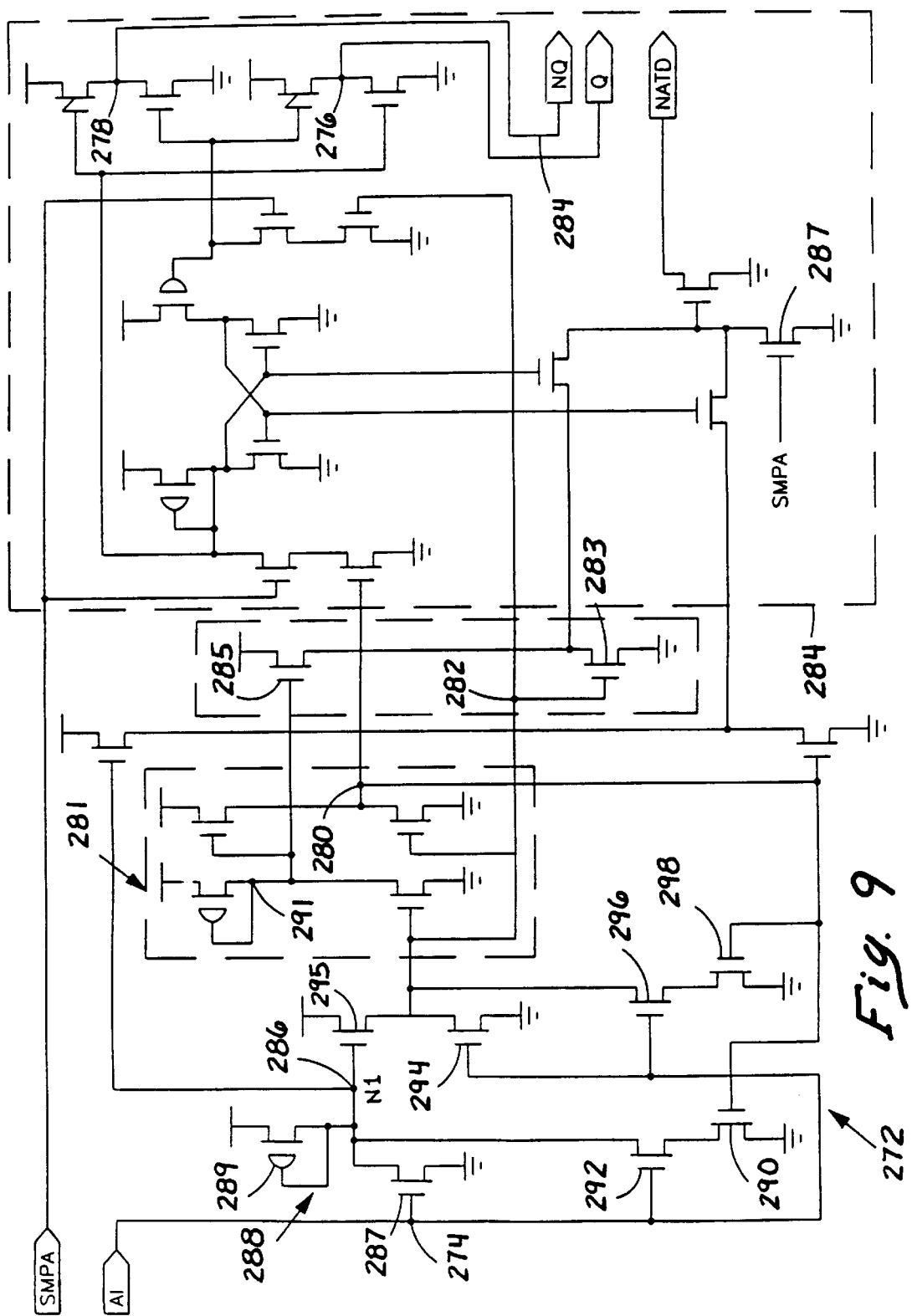

FIG. 9 is a schematic diagram illustrating an NMOS input receiver according to the invention.

Figure 10:
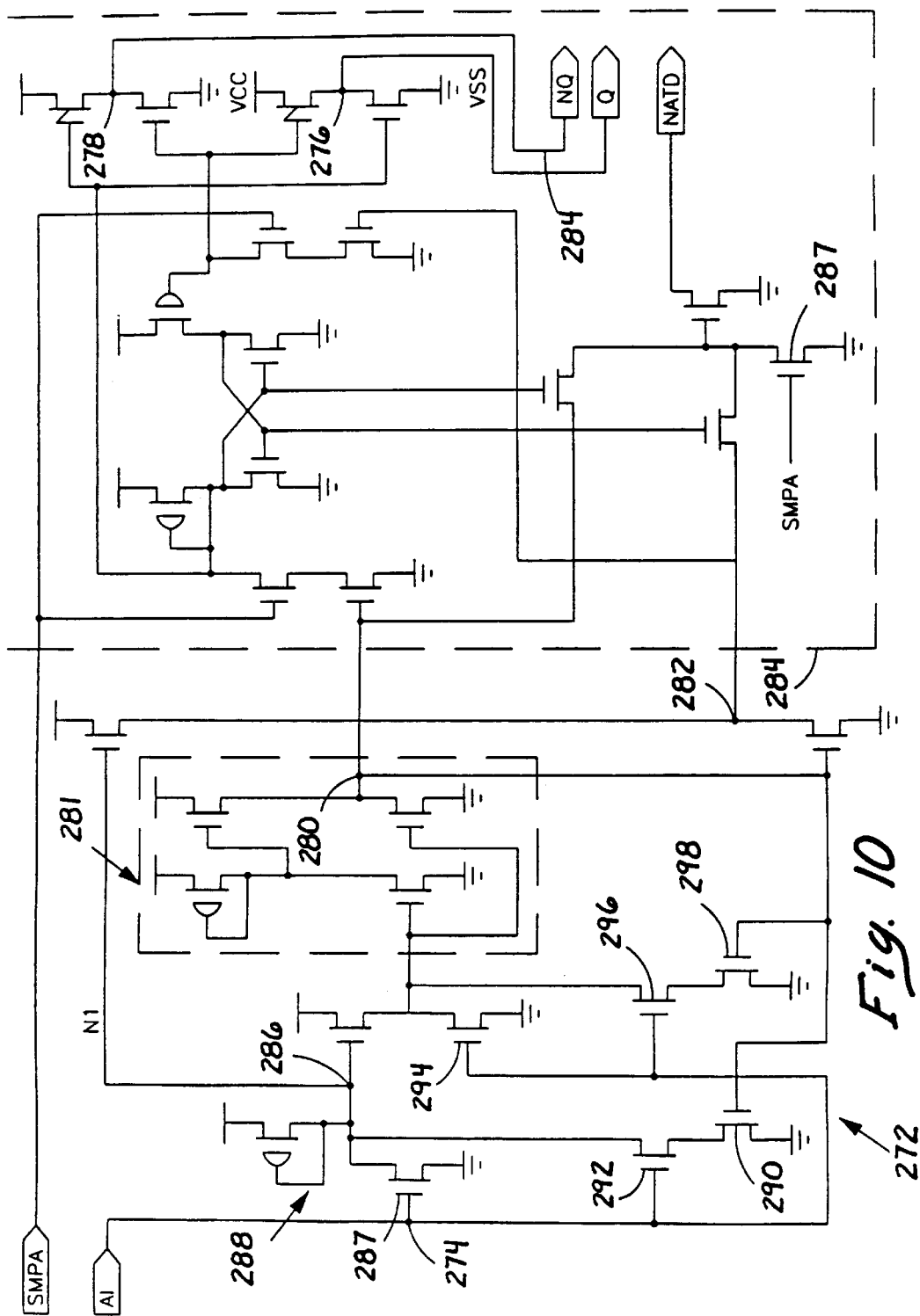

FIG. 10 is a schematic diagram a prior design for of an NMOS input receiver over which the invention is an improvement.

Figure 11:
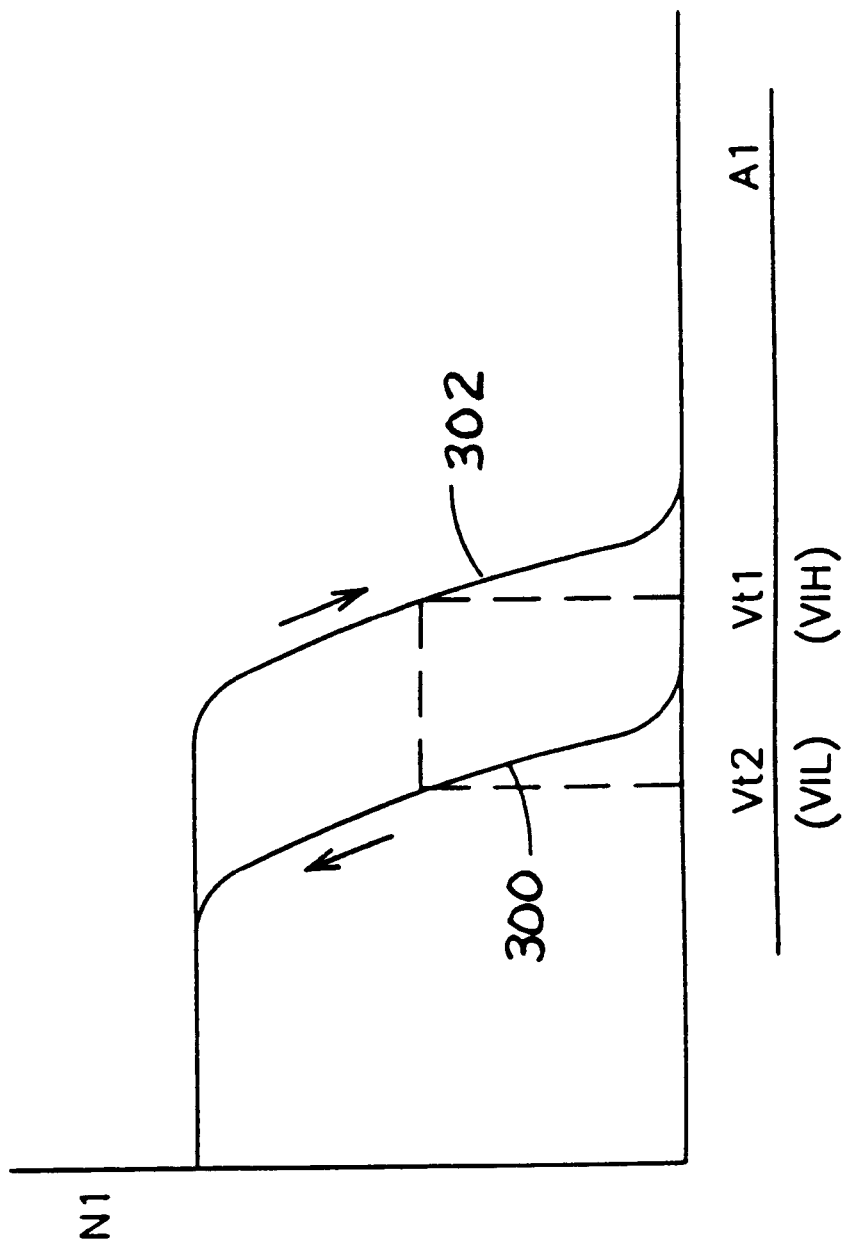

FIG. 11 is a state diagram which illustrates the input voltage to the circuit of FIG. 9 on its horizontal axis and the output of the first inverter stage on its vertical as illustrating the hysteresis operation of the circuit.

Output Driver Control for ROM and RAM Devices

Figure 12:
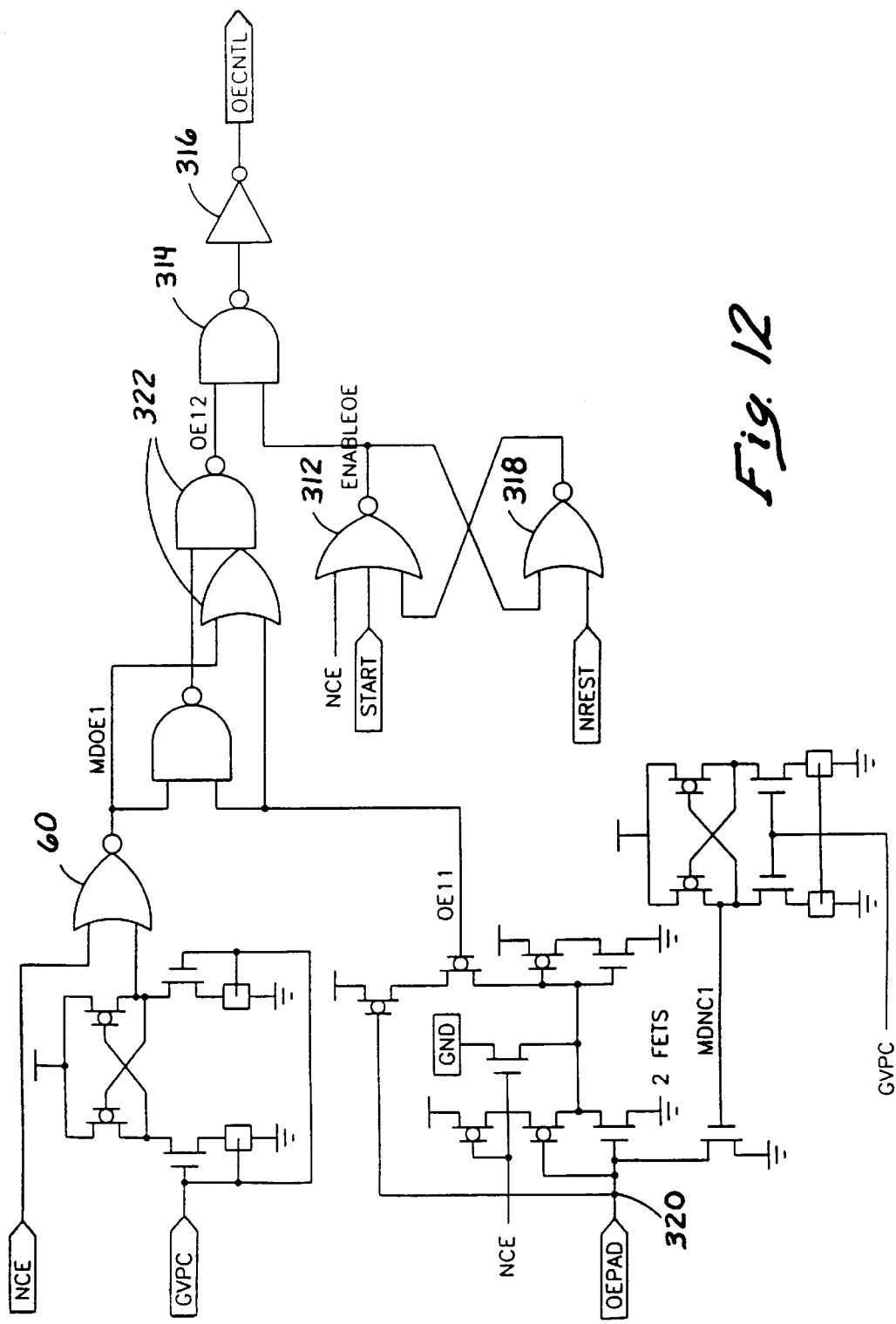

FIG. 12 is a schematic of an output enable control circuit which generates a control signal, OECNTL.

Figure 13:
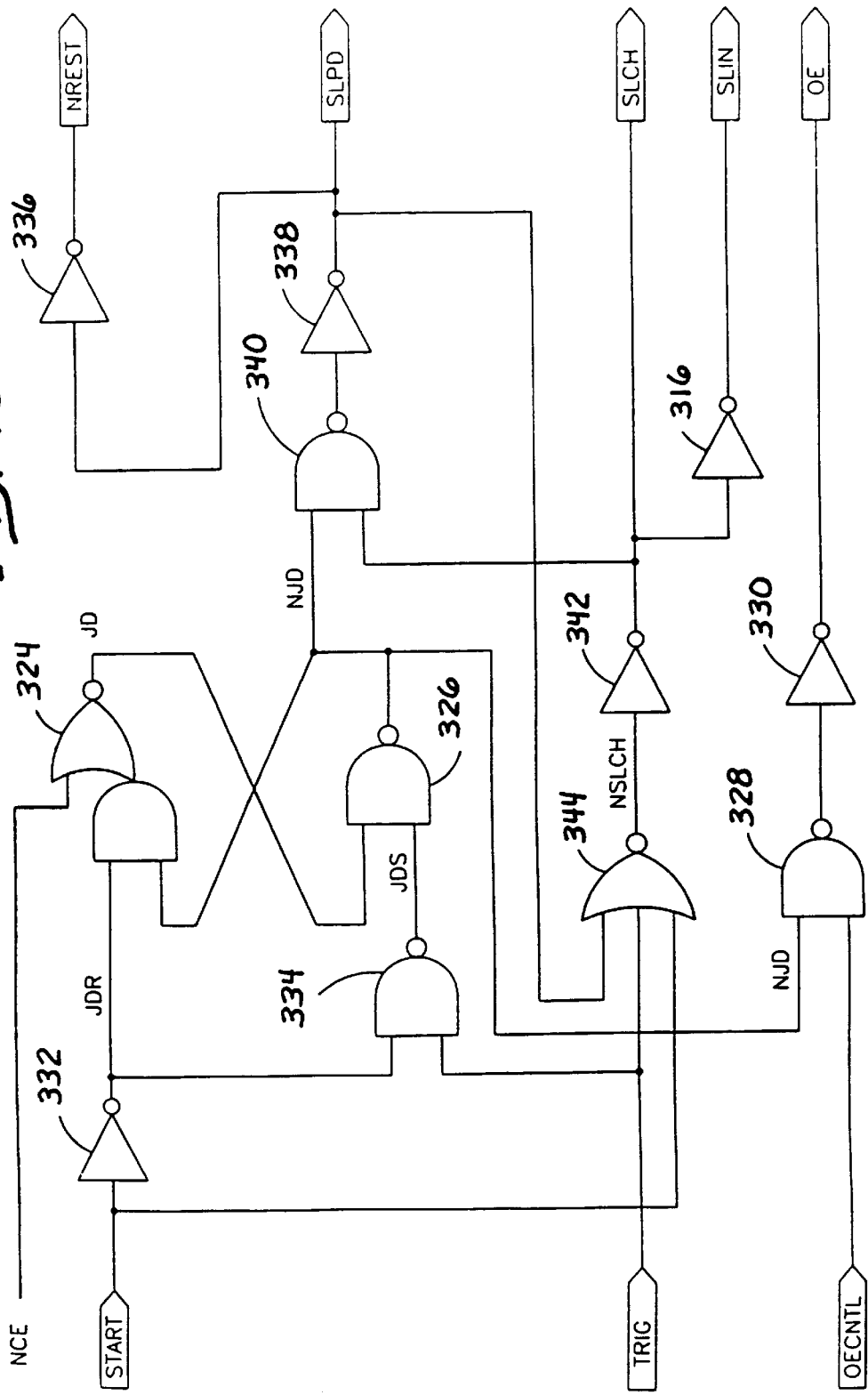

FIG. 13 is a schematic of an output driver control circuit which utilizes the control circuit, OECNTL, to generate the plurality of output driver control signals.

Figure 14:
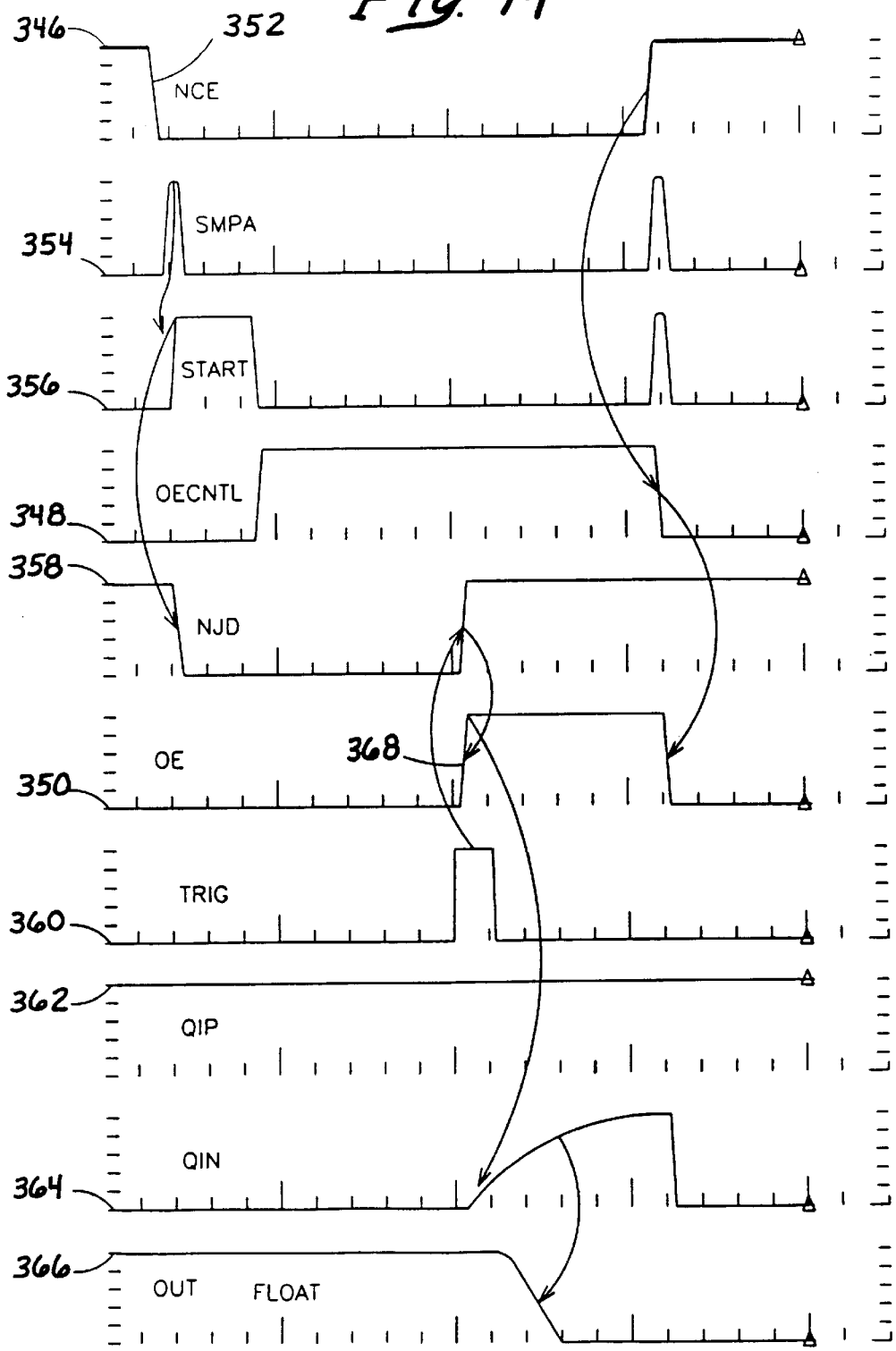

FIG. 14 is a timing diagram of primary and secondary clock signals generated according by the circuitry of FIGS. 12 and 13 when chip enable, CE, is used to switch NCE high at the end of the read cycle, and OECNTL, as described in FIG. 12 is forced low and remains low during the standby mode.

Figure 15:
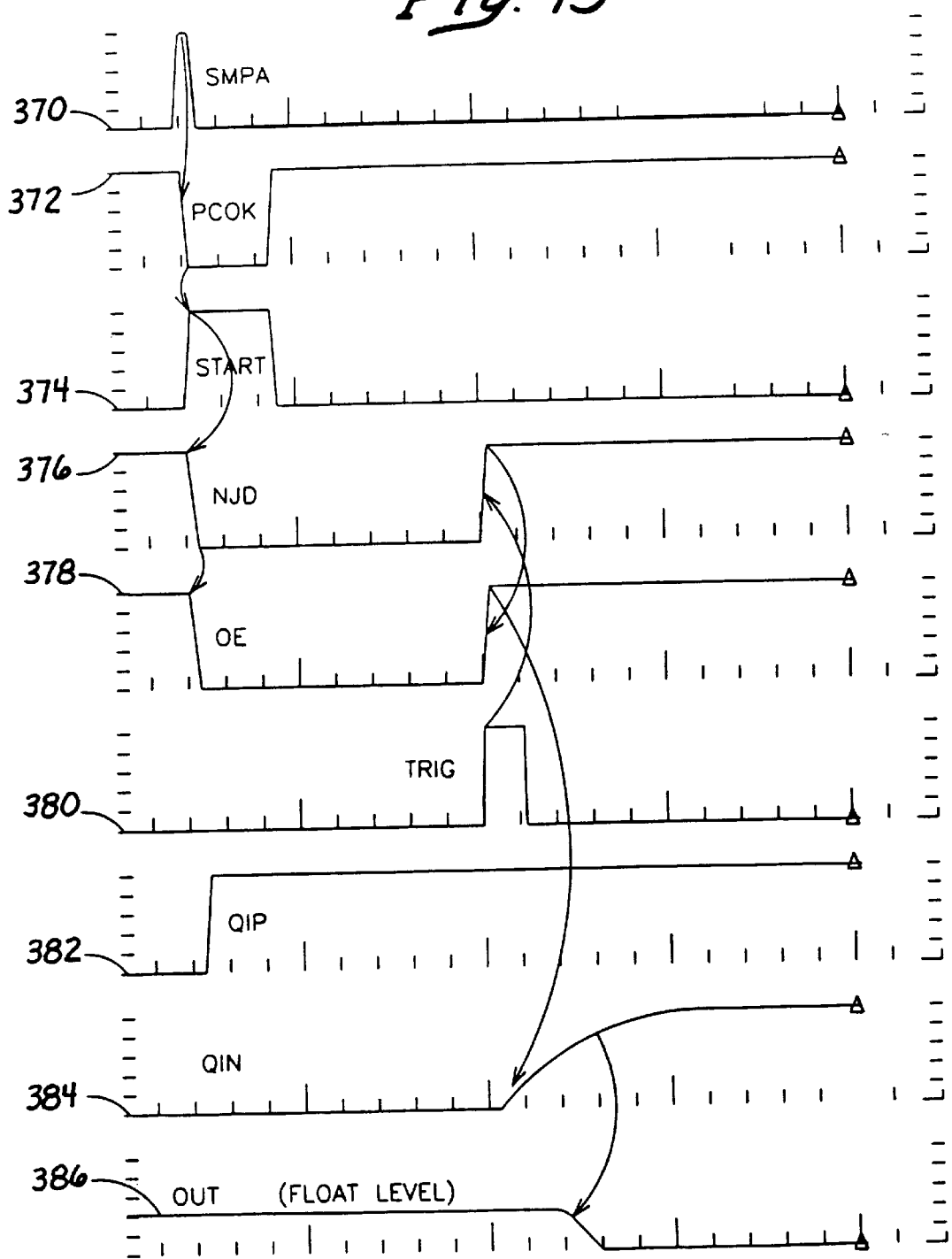
Figure 16:
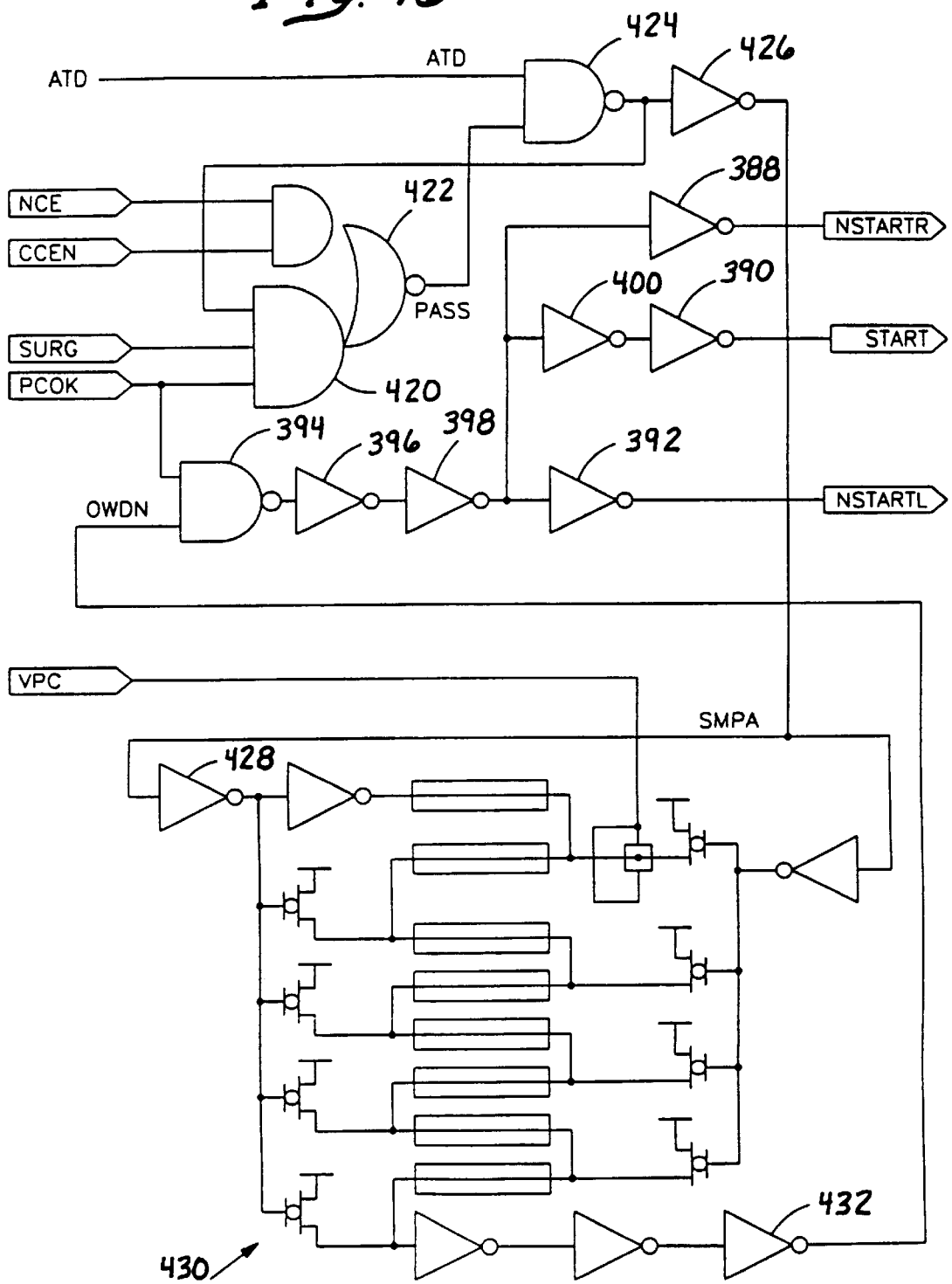

FIG. 15 is a timing diagram of primary and secondary clock signals generated when the data from the memory core is ready to latch into output, and a TRIG pulse is generated by the memory TRIG circuit Dynamic ROM Design for Read Cycle Interrupts FIG. 16 is a schematic of a clock control circuit devised according to the invention.

Figure 17:
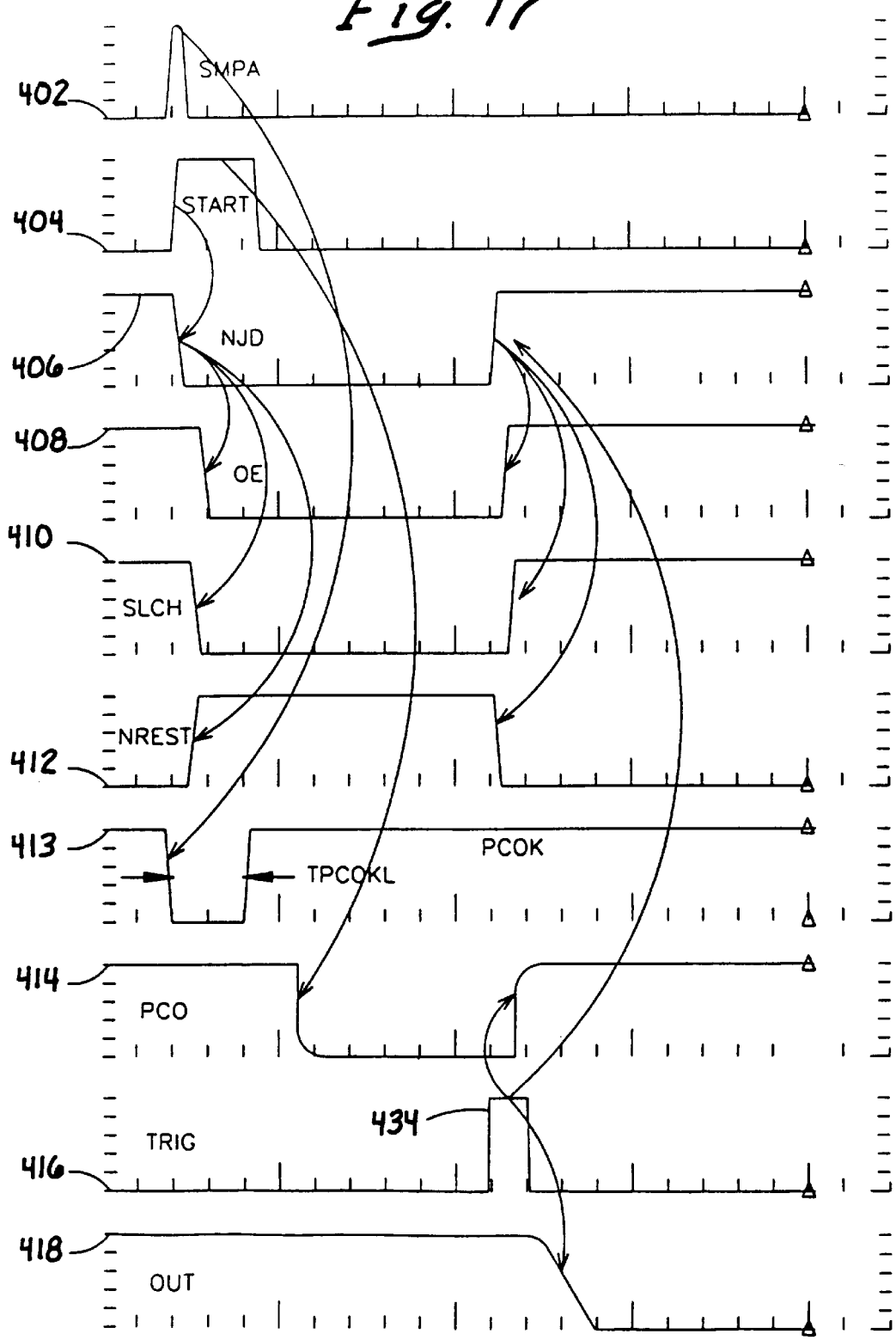

FIG. 17 shows an uninterrupted read cycle with three of the primary clocks and six of the secondary clocks together with the data output signal, OUT.

Figure 18:
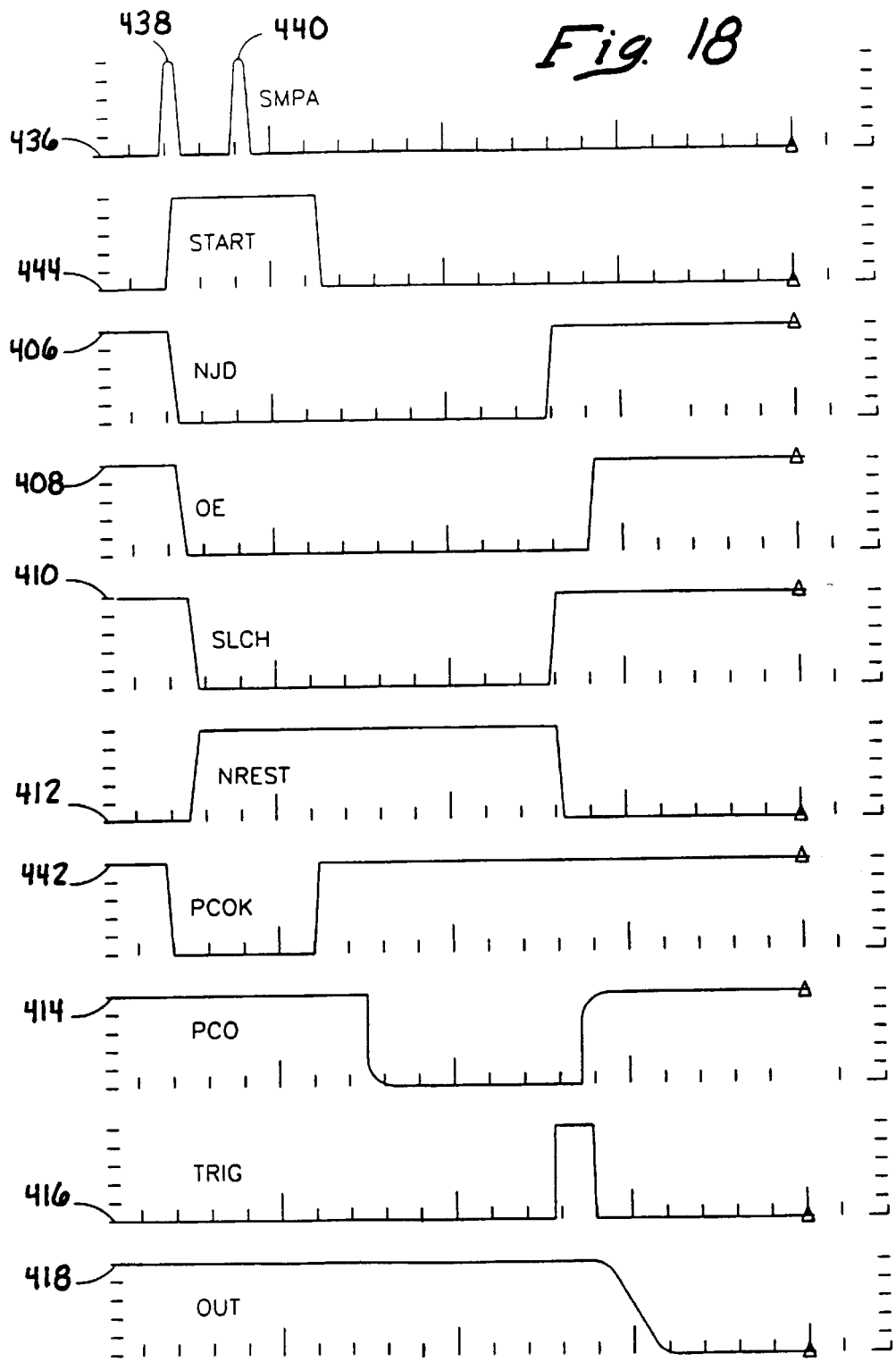

FIG. 18 shows the operation of a read cycle which is interrupted somewhat later in time when PCOK is low and START high.

Figure 19:
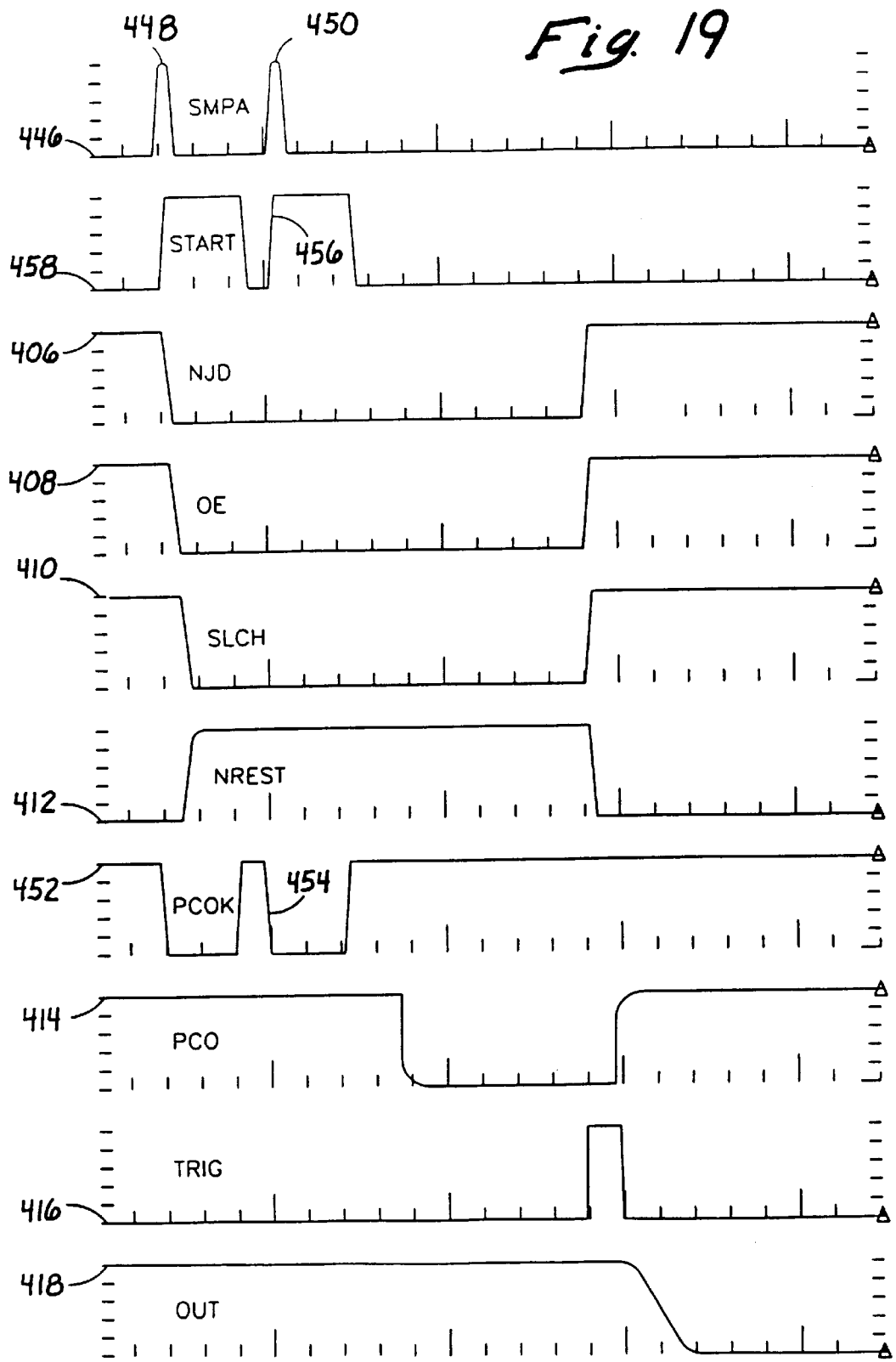

FIG. 19 shows a read cycle which is interrupted at a later time just after the PCOK clock goes high.

Figure 20:
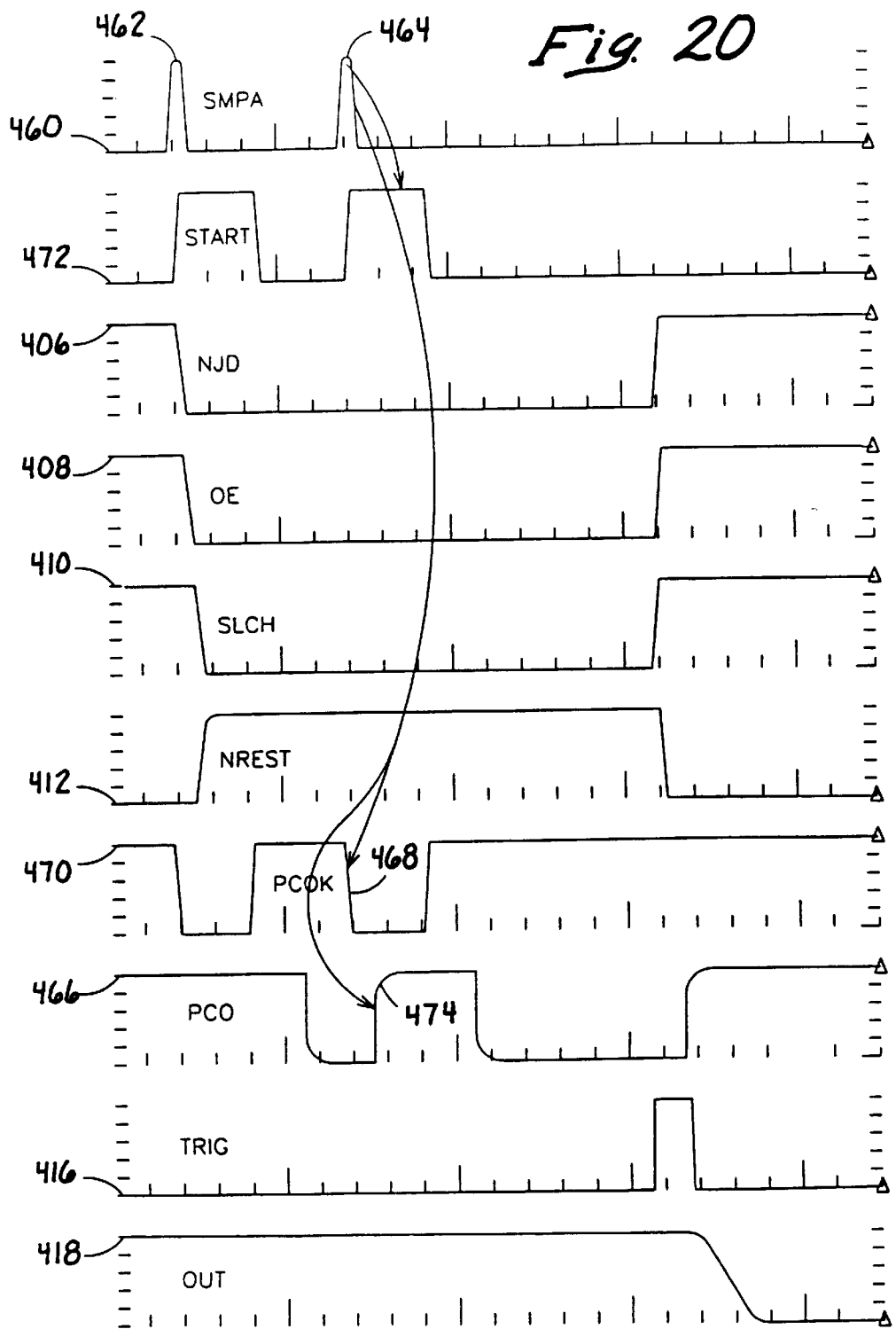

FIG. 20 shows a memory read cycle which is interrupted still later just after PCO switches low.

Figure 21:
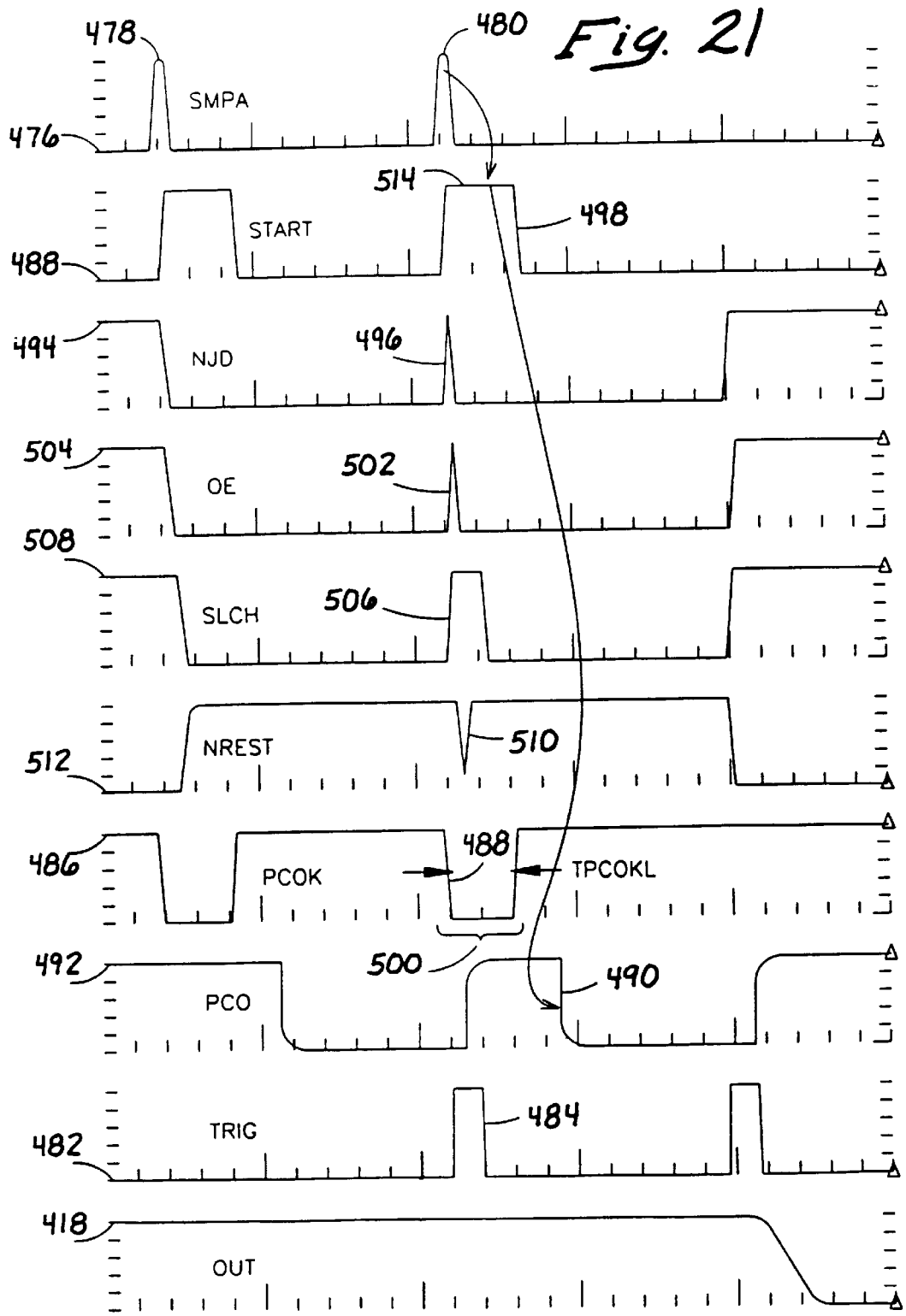

FIG. 21 shows a memory read cycle which is interrupted still later just after the TRIG control signal switches high.

Figure 22:
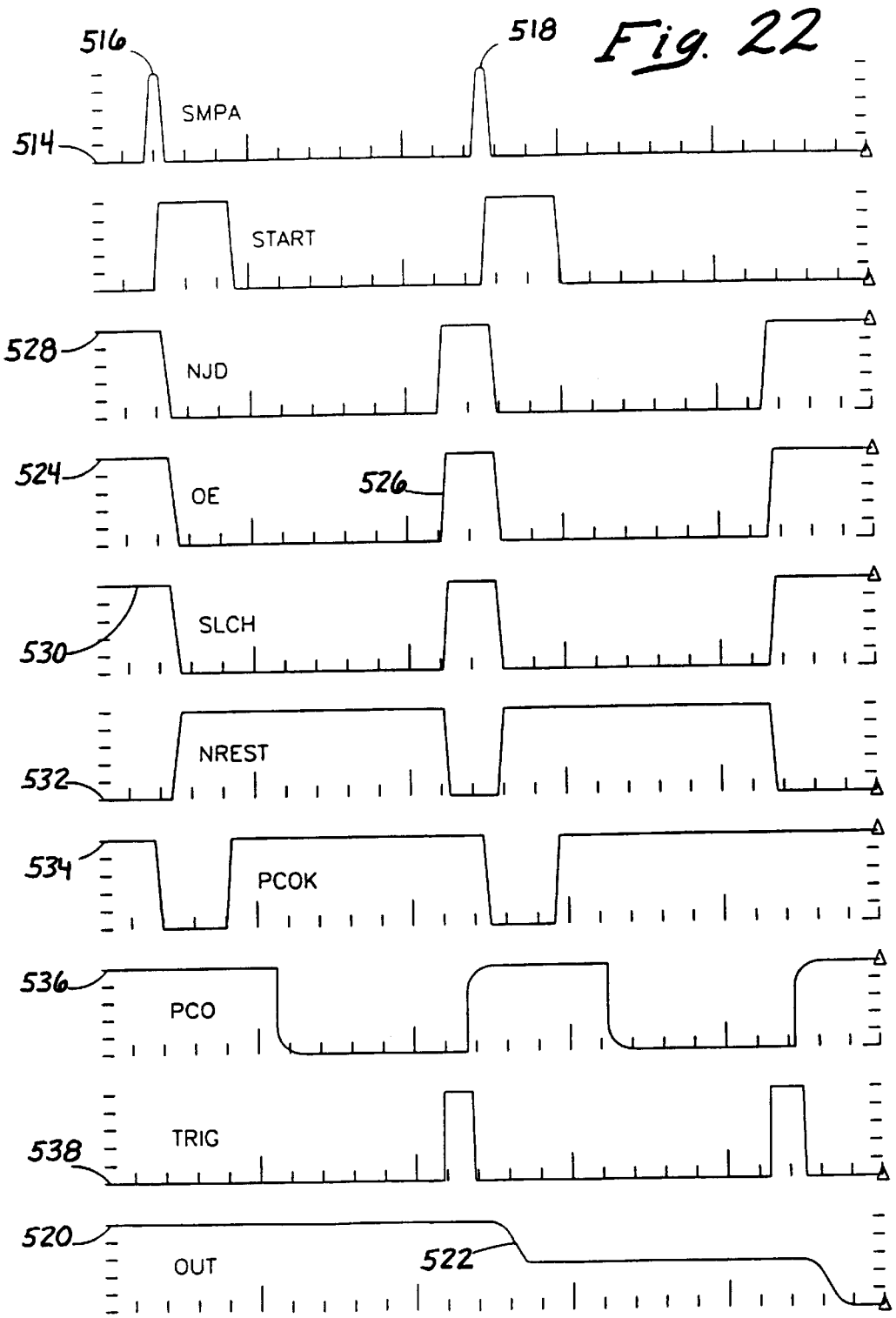

FIG. 22 shows what happens when a read cycle is interrupted later just as the data output signal, OUT, switches.

ROM Code Mask Programmable CMOS Latch

Figure 23:
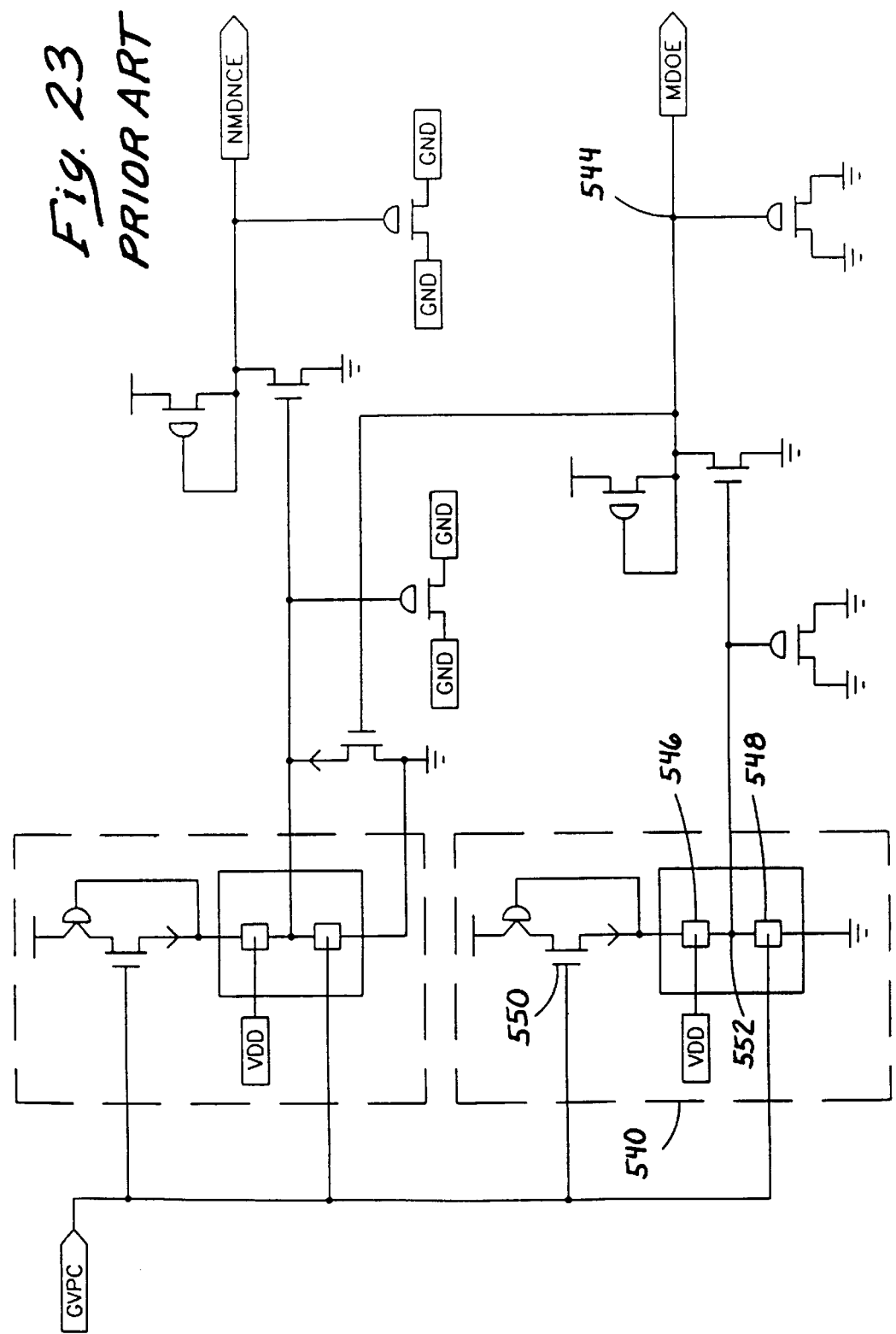

FIG. 23 is a schematic diagram of a prior art NMOS version of a ROM code mask programmable NMOS latch.

Figure 24:
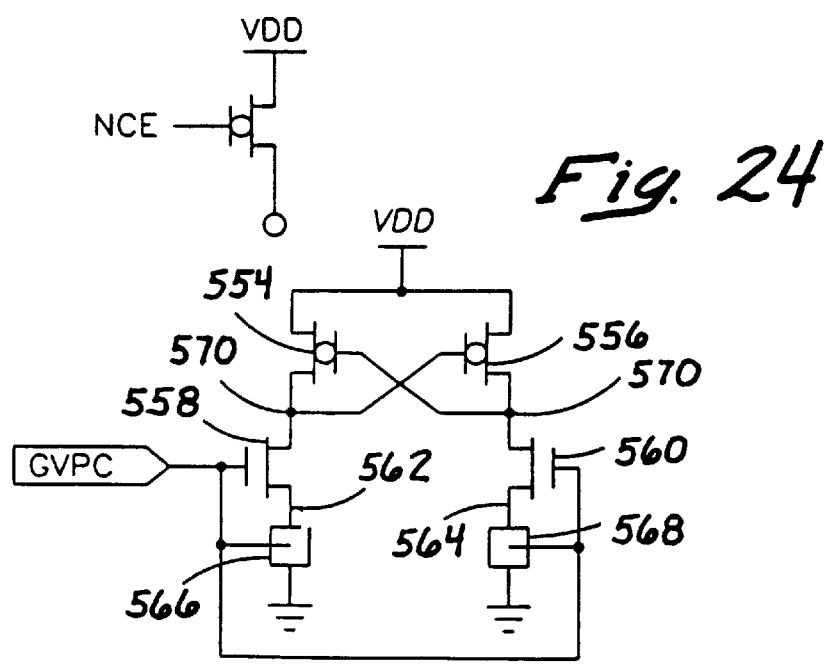

FIG. 24 is a schematic of a ROM code mask programmable CMOS latch which replaces the function of the NMOS latch in FIG. 23.

Figure 25:
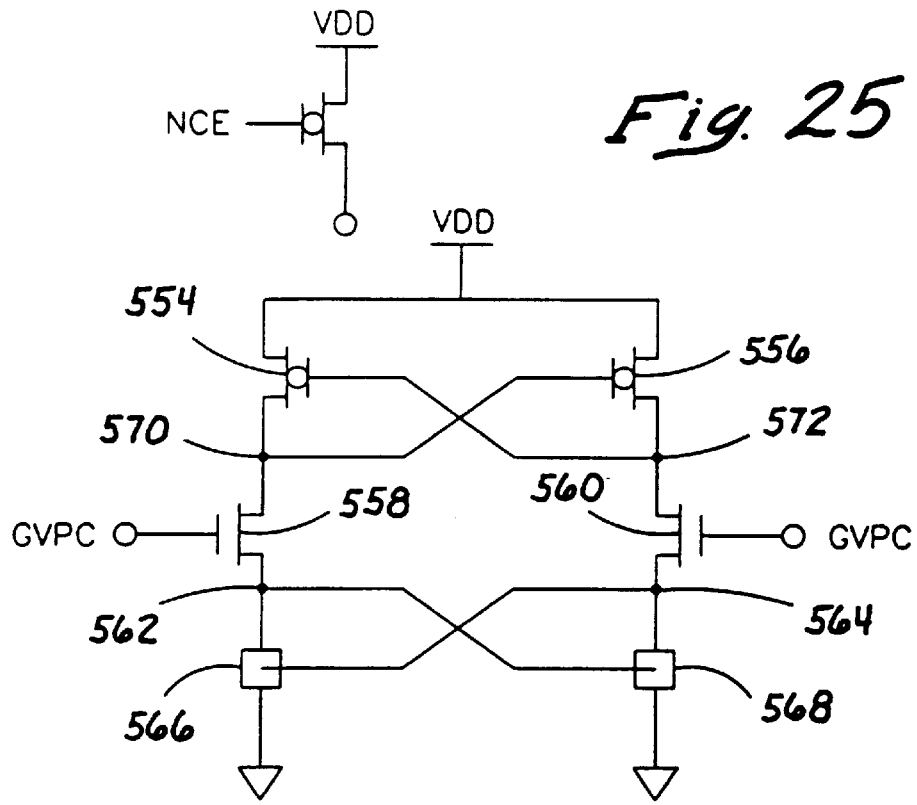

FIG. 25 is an alternative embodiment for CMOS latch to that shown in FIG. 24.

The invention and its various embodiments can now be understood in connection with the illustrations by turning to the following detailed description.

DETAILED DESCRIPTION OF THE PREFERRED EMBODIMENTS

An Improved Output Driver to Control Switching Noise

The rate of increase or decrease of the rising and falling edge respectively of an output driver in a read-only memory circuit is provided by driving a CMOS output amplifier by gate control signals whose rate of increase or decrease in turn is controlled by a control signal SLOW. The signal SLOW is generated based upon the speed of operation of the ROM and is binary, one state being indicative of normal speed of operation and a second state being indicative of a slow speed of operation of the ROM. When the signal SLOW is high, the rate at which complementary gate drive signals are applied to the CMOS amplifier are generated at a first or normal rate. However, when the signal SLOW is low, the rate of generation of these gate drive signals is also decreased to correspondingly decrease to switching speed of the CMOS amplifier.

A voltage precharge signal VPC is also applied to the rate controlling circuit so that variations in the precharge voltage indicative of manufacturing parameters, voltage variations and temperature variations directly effect the rate at which the gate drive signals are generated and hence the switching speeds of the CMOS amplifier.

The rate of switching of both the rising and falling edge of the CMOS amplifier is independently controlled by independently varying the width of the FET transistors used to generate the corresponding gate drive signals.

Figure 1:
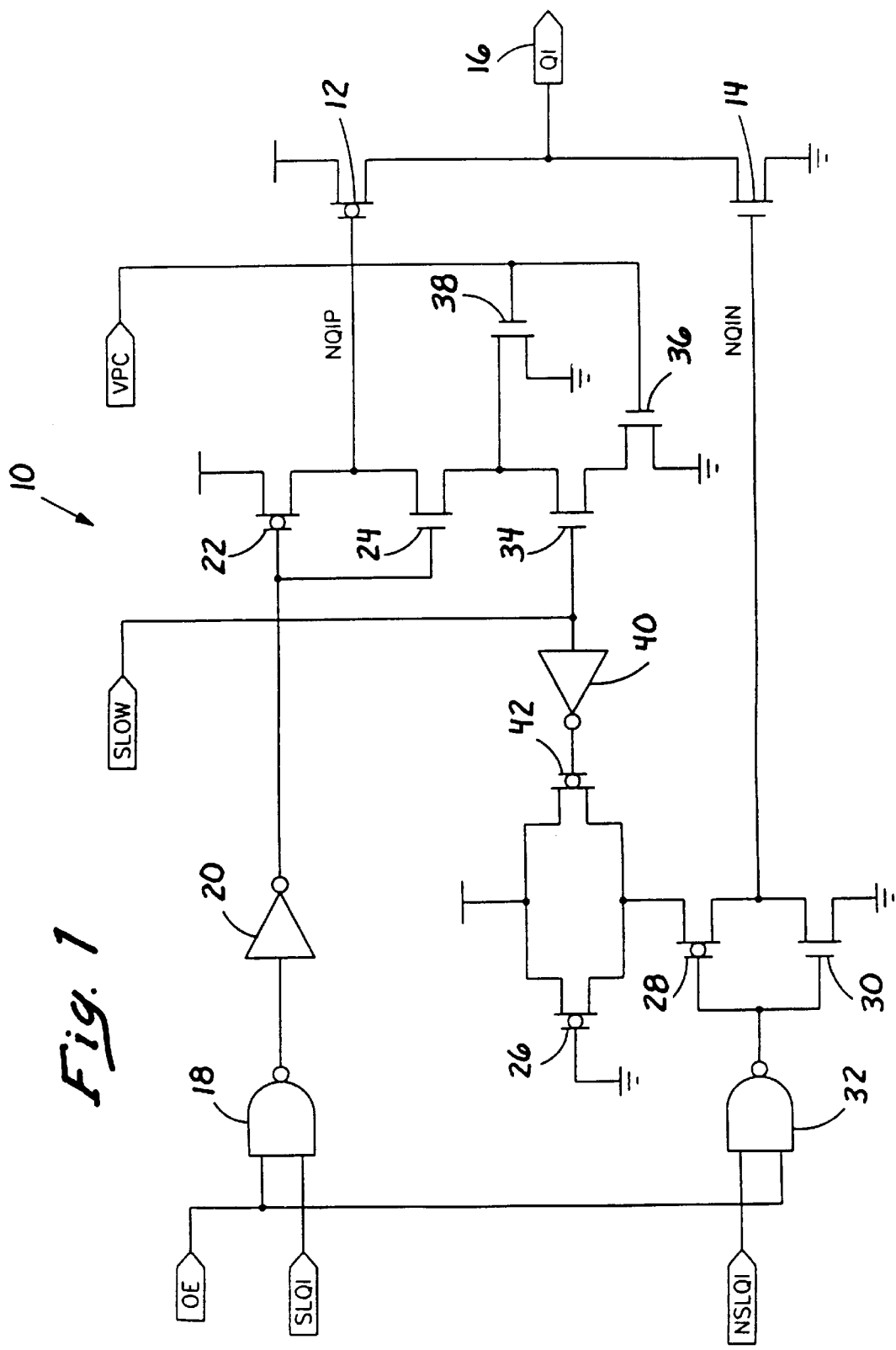
FIG. 1 is a schematic of the improved output driver of the invention.

The output driver of the invention, denoted generally by reference numeral 10, is schematically depicted in FIG. 1. Output driver 10 is comprised of wide PMOS field effect transistor (FET) 12, a wide NMOS FET 14 whose gates are coupled to circuitry to drive FETs 12 and 14 and to slow their switching speed according to the invention. Output 16 of FETs 12 and 14 is used to drive large off-chip capacitances. The circuitry for logic gates used to drive FETs 12 and 14 in turn are comprised of NAND gate 18, inverter 20, FETs 22–30, 38 and NAND gate 32. The circuitry used to slow the switching speed of FETs 12 and 14 are comprised of FETs 34–36, inverter 40 and FET 42.

The switching of the output driver 10 is controlled by the output enable signal, OE. Output Enable, OE, is a signal which enables the output driver circuit. If output enable, OE, is high, then data from the sense amplifier may be transferred off the chip. If output enable, OE, is low, then the output 16 is tristated. If OE is low, then the gate of output FET 12 is high, the gate of output FET 14 is low and the output 16 is tristated. When the signal OE is high, the output of the sense amplifier, SLQI and NSLQI, which is provided as an input to NAND gates 18 and 32 is allowed to pass to output 16. The signals SLQI and NSLQI are the complementary outputs of a sense amplifier circuit for the i-th bit.

The signal SLOW is the output of a bias generator. The delay of an RC circuit and the gate delay circuit is compared and the result is stored in a latch SLOW is the result of this comparison. If SLOW is low, then the output driver switching speed will be reduced. If SLOW is high, then the output driver switching speed will remain unchanged.

Output driver 10 has two modes of operation which are controlled by the signal, SLOW, which is provided as an input to inverter 40 and FET 34. If the signal SLOW, is high, then output driver 10 switches at normal speed. If the signal SLOW, is low, then output driver 10 switches more slowly.

The two switching speeds of FET 14 are independently controlled as are the switching speeds of FET 12. The switching speed of FET 14 is controlled by FETs 26 and 42. When the signal SLOW, is high, PFET 42 will be turned on and the switching speed of FET 14 is unchanged. When the signal, SLOW, is low, FET 42 is turned off, and the switching speed of FET 14 is controlled by FET 26 and 28. Because FET 26 provides more resistance when in circuit alone than when in parallel with FET 42, the switching speed of FET 14 is reduced.

The switching speed of FET 12 is controlled by FETs 24, 34–38. When the signal, SLOW, is high, FET 34 is turned on and the current path through FETs 34 and 36 is enabled. When the signal SLOW, is low, FET 34 is turned off. The gate of FET 12 must discharge then through FETs 24 and 38. As a result, the switching speed of FET 12 is reduced.

The seven FETs 24–28, 34–38 and 42 control the switching speed of FETs 12 and 14. These seven FETs provide independent switching speed control for both normal and slow switching and for the rising and falling edges of the output.

It should be noted that the voltage precharge signal VPC, is used to control the gates of FETs 36 and 38. VPC varies with manufacturing parameters, power supply voltage variations and temperature variations. As VPC varies, the conductivity of FETs 36 and 38 also correspondingly vary. For slow conditions, VPC is about 2.3 volts while for faster conditions, VPC is about 1.8 volts. As the VPC voltage drops, so does the conductivity of FETs 36 and 38. The switching speed of FET 12 is correspondingly reduced. This reduction in switching speed further reduces the output driver switching noise. By using VPC to control the conductivity of FETs 36 and 38, the switching speed of output driver 10 is more accurately controlled over a larger range of operating conditions.

Figure 2:
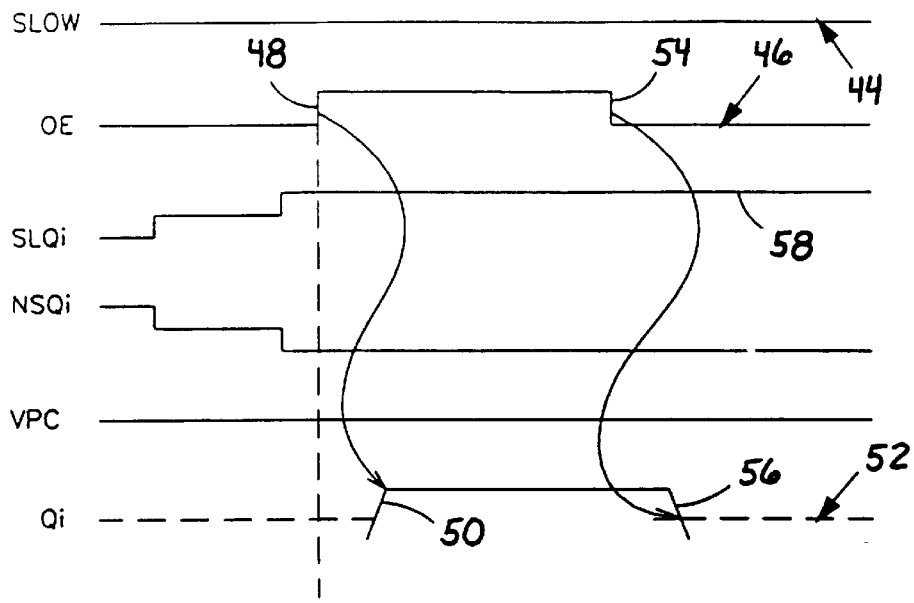
FIG. 2 is a timing diagram of the output driver of FIG. 1 in the condition where the signal, SLOW, is high.

The operation of the circuit is better illustrated in connection with the timing diagrams of FIGS. 2 and 3. FIG. 2 is a timing diagram of output driver 10 wherein signal, SLOW, is high at all times of interest as depicted by line 44. When output enable, OE, goes high as depicted on line 46 at edge 48, this will trigger after a switching delay the rising edge 50 of the output shown by line 52. The falling edge 54 of the output enable signal, OE, in turn triggers falling edge 56 of output signal 16 to a tristate level as depicted in FIG. 2.

Figure 3:
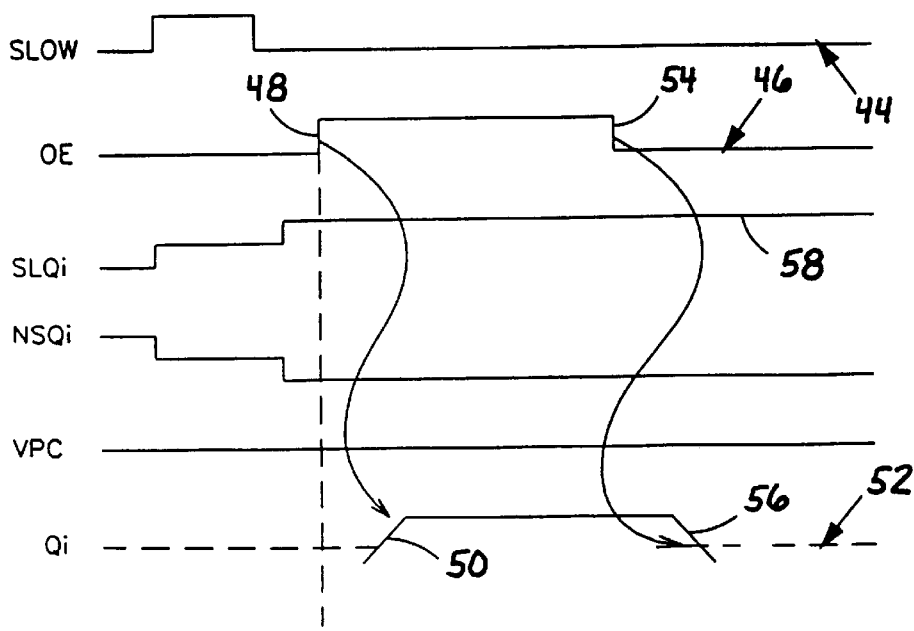
FIG. 3 is timing diagram of the output driver of FIG. 1 in a condition where the signal, SLOW, is low.

FIG. 3 is a timing diagram which shows in comparison the operation of output driver 10 of FIG. 1 when the control signal SLOW, is low during the times of interest A comparison of rising edge 50 of output 16 on line 52 of FIG. 3 with the corresponding rising edge 50 of the line 52 in FIG. 2 illustrates that the rise time is much slower in the situation depicted by the timing diagram of FIG. 3. Similarly, the falling edge 56 of the output is also provided with a more gentle falling edge. The timing diagram of FIGS. 2 and 3 assume that the output bit is high in question as denoted by signal SLQI on line 58. However, an inverted output from that shown in FIGS. 2 and 3 would be the corresponding result in a case where SLQI is logically low. Although not depicted in FIGS. 2 and 3, the switching speeds would also be dependent upon the level of the precharge voltage VPC as described above.

The control of the switching speeds of output driver 10 is accomplished by varying the widths of seven FETs, namely FETs 24–28, 34–38 and 42. In the NMOS version of output driver 10 described above in the copending application, now issued as U.S. Pat. No. 5,241,497, the switching speed was controlled by a control signal, BIAS. The value of BIAS was set up as supply voltage VDD for normal switching speed mode. The signal BIAS switched from about 2.0 volts to the supply voltage VDD to reduce the switching speed. In the previously described output driver, the signal BIAS has a same path for both normal and slow switching speed modes. When the signal BIAS is at the level of VPC, the prior output driver switched more slowly, but how much more slowly was determined by the voltage of VPC which was not in any manner controlled. In this sense then, the prior NMOS design, unlike the improvement described above, did not allow for independent control of the switching speed for normal and slow switching speed modes.

The same seven transistors switch the speed of both the rising and falling edges which are controlled by the selected width of these seven transistors. The widths of these transistors may be optimized according to the spirit of the invention to minimize switching noise on both the supply voltage VDD and the ground voltage VSS while still meeting the maximum access time requirements of the ROM.

In the present improvement, the bias generator which generates SLOW, and output driver 10 are designed to reduce output driving switching noise. The improved CMOS design reduces both VSS and VDD noise when SLOW is logical low. In contrast the prior NMOS design only controlled the falling edge of the output driver and therefore only reduced noise on VSS. The noise on VDD was not reduced by the previous NMOS design.

As stated above the precharge voltage, VPC, varies with manufacturing parameters, voltage variations and temperature variations. As described above, VPC and output driver 10 controls the output driver switching speeds. VPC is in general lower for faster ROMs. The slower VPC is used to slow the output driver switching speed for these faster ROMs. By using VPC to help control the output driver switching speed, the switching speeds can be controlled more accurately over a larger range of operating conditions.

Because the delay for both normal and slow switching modes may be independently controlled, output driver 10 allows an increase in the switching delay as much as the maximum access time requirement will allow, and thereby allowing an optimization of the reduction of switching noise.

A Bias Generator for Control of Output Buffer Switching Noise

A circuit for generating the bias control signal, SLOW, used to bias the switching speeds of the output drivers of the read-only memory, is provided through a combination of an RC delay circuit, a gate delay circuit, a comparator and a latch. The START signal, indicative of the beginning of an address cycle in the read-only memory, initiates the precharging and resetting of gates in the RC delay circuit and gate delay circuit respectively. The propagation of the START signal through the gate delay circuit is compared to the decay of the charge precharged onto the RC delay circuit. Depending upon whether the gate delayed signal becomes active before or after a trigger point in the RC charge decay, the latch is set or reset to generate the control signal, SLOW. The control signal, SLOW, is set at first logic state to be indicative that the gate delay is faster than the RC delay within the read-only memory circuit or at a complementary second logic state to indicate that the gate delay is slower than the RC delay typically encountered within the read-only memory.

FIGS. 4a–4b illustrate a schematic of an improved bias generator which replaces the function of the circuit schematically depicted in FIGS. 26 and 30 of the above denoted copending application. The circuit shown in FIGS. 4a–4b are intended to detect relative differences in circuit speed as may be caused by voltage, temperature or processing tolerances in order to provide a means for compensating for these variations, when they might adversely affect the circuit the performance, particularly the output buffer switching speeds and hence the noise placed on the output by such switching.

The output of the circuit of FIG. 4 is the control signal, SLOW, the use of which is described above in connection with FIGS. 1–3. The output of the bias generator circuit, SLOW, is the result of a comparison between the delay in an RC circuit 66 and gate delay circuit 98 which is stored within a latch 86. SLOW is low when the switching speed of the output drivers are to be reduced. SLOW is high when the switching speed of the output driver remains unchanged.

The operation of the circuit is initiated by a discrete control signal, START, generated on the chip which is indicative of the start of a read operation of the read-only memory to which the output buffers are coupled. The signal START is a voltage pulse provided at the beginning of each read cycle. The signal START goes high at the start of each read cycle and goes low in the middle of the read cycle as depicted in the timing diagrams of FIGS. 5 and 6. When the signal START goes low, a control signal is passed through the RC and gate delay circuits and a comparison is made.

The bias generator circuit of FIGS. 4a–4b is comprised of an RC delay circuit 66, gate delay circuit 98 and latch 86. On falling edge 122 of the signal START, shown on line 109 of FIGS. 5 and 6 the delay through RC circuit 66 and gate delay circuit 98 are compared. The results of comparison determines the state of latch 86. The output of latch 86, SLOW, is then used in connection with the output driver as described above to selectively reduce the switching speed of the output drivers.

START goes high at the beginning of a new read cycle in the ROM. Rising edge 110 of START precharges RC delay circuit 66, in particular resistor 68, and gate delay circuit 98, primarily inverters 100 and 104. A large PMOS FET in inverter 64 and additional PMOS FET 78 quickly precharge RC delay circuit 66 when the signal START goes high. Inverter 65 and NAND gate 102 quickly reset gate delay circuit 98. The output of RC delay circuit 66 is amplified by inverter 76 which is designed with long channels to reduce the effect of process variations and to achieve a stable trigger point.

Latch 86 is enabled by the output of NOR gate 60. The output of NOR gate 60 goes high when the signal START goes low and stays high until the output of RC delay circuit 66 goes low and the output of inverter 76 goes high. Falling edge 122 of the START signal causes a race between RC delay circuit 66 and gate delay circuit 98. The outputs of inverters 94 and 92 are the inputs to latch 86. The state of latch 86 is determined by falling edge 130 on node 80, the output of NOR gate 60. If gate delay circuit 98 is faster than RC delay circuit 66, then the output of inverter 94 will be low and the output of inverter 92 will be high when node 80 goes from high to low. Since the output of inverter 92 is high before node 80 goes from high to low with falling edge 130, there exists a path from the signal SLW at the output of FET 82 to ground through FETs 82 and 88. SLW or the upper input to latch 86 therefore goes to ground before the falling of node 80 latches the state of SLW at ground. This causes the output of latch 86 to go low.

Conversely, if gate delay circuit 98 is slower than RC delay circuit 66, the output of inverter 94 will be high and the output of inverter 92 will be low when node 80 goes from high to low with falling edge 130. Since the output of inverter 92 is low before node 80 goes from high to low on edge 130, there exists a conductive path from the upper output of latch 86, FST, to ground though FETs 84 and 90. FST thus goes to ground before the falling edge of node 80 latches the state of FST at ground. The lower output of latch 86 is thus pulled up and signal SLOW stays high.

Consider now the operation of the circuit in more detail. START is provided as an input to NOR gate 60 and is inverted by inverter 62 to generate the signal NSTART. NSTART is again inverted by a second inverter 64 and then coupled to an RC circuit, generally denoted by reference numeral 66. RC circuit 66 includes a plurality of integrated circuit resistors 68 in series and a plurality of parallel coupled integrated circuit FET capacitors 70 which can be selectively coupled to node 72 by means of metal cut and open options 74.

Node 72 is coupled to the input of an inverter 76 which is also coupled and parallel to the output of a pull-up PFET 78 gated by the output of inverter 62. The output of inverter 76 is coupled together with the signal, START, to the input of NOR gate 60. The output of NOR gate 60 is the control node 80. The gates of NFET's 82 and 84 are coupled to node 80 and have their output coupled to a CMOS latch generally denoted by reference numeral 86. The output of CMOS latch 86 is the signal, SLOW. The inputs to FETs 82 and 84 are selectively coupled to ground through FETs 88 and 90 respectively. The gate of FET 88 is coupled to node 93 while the gate of FET 90 is coupled to the output of an inverter 94.

The output inverter 92 in turn is coupled to node 93 and the input of inverter 94 with the input of inverter 92 coupled in turn to node 96. Node 96 is the output of a gate delay circuit, generally denoted by reference numeral 98, having the signal NSTART as its input. Circuit 98 is comprised of a first plurality of inverters 100 whose output is coupled together with NSTART to a NAND gate 102. The output of NAND gate 102 in turn is coupled to a second plurality of inverters 104 whose output is coupled to node 96.

The operation circuit of FIGS. 4a–4b may be better understood by reviewing the timing diagrams of FIGS. 5 and 6. FIG. 5 is a timing diagram of the operation of the circuit of FIGS. 4a–4b in the case where the gate delay is slow. For example, in line 106 the address becomes valid for a new read cycle at a time 108. This event in turn triggers rising edge 110 of the signal START using conventional logic circuitry (not shown). Rising edge 110 of the signal, START, in turn generates the falling edge 112 of the complementary signal NSTART at the output of inverter 62. Falling edge 112 of NSTART affects node 72 as shown by line 72' in FIG. 5 and affects node 96 as shown in by line 96' in FIG. 5 to generate rising edge 114 and 116 respectively. Line 72' therefore indicates an RC delay while line 96' indicates the effect of the gate delay.

Rising edge 116 on node 96 shown on line 96' of FIG. 5 in turn causes falling edge 118 of the signal shown on line 92', which is the output of inverter 92. One gate delay later, rising edge 120 is generated at the output of inverter 94 as depicted on line 94' of FIG. 5.

Falling edge 122 of the START signal shown on line 109 triggers one gate delay later rising edge 124 of NSTART on line 111 and then as determined by the precharged condition of RC circuit 66, the rising edge 126 of the signal at node 80 shown on line 80' in FIG. 5 after START has gone low.

Since at this point in time NSTART is high, FET 78 is turned off and the input to inverter 76 is allowed to float with node 72. The output of inverter 64 is now low and node 72 begins to discharge into inverter 64 according to the RC time constant as set by the metal option 74 as depicted in the RC delay slope 128 in line 72'. This will ultimately cause node 80 to drop at falling edge 130 as shown in line 80' once a trigger point for inverter 76 has been reached.

In the meantime, the gate delays being experienced in circuit 98, since the situation of FIG. 5 assumes a chip which is characteristic of a slow gate propagation, propagates the rising edge 124 of NSTART through circuit 98 to create falling 132 at node 96 as illustrated on line 96'. One gate delay later, falling edge 132 creates rising edge 134 as illustrated on lines 96' and 92' respectively. However, while node 80 is high between edges 126 and 130, when the output of inverter 92 is low, a zero will be coupled to the input FST of latch 86 maintaining the signal SLOW, high as shown in 138, which is depicted under the presumption that SLOW was previously high due to a slow gate delay. After node 80 goes low, shutting off coupling FETs 82 and 84, the falling edge 132 of the signal on node 96 will not be transmitted through to latch 86 and will leave the signal SLOW will remain high.

Turning now to the case where there is a fast gate delay, the timing diagram of FIG. 6, wherein each of the corresponding events and elements are referenced with like reference numerals, shows instead a smaller gate delay on line 96' and the falling edge being generated much sooner, namely in the time interval between edges 126 and 130 of node 80 depicted in line 80'. In this case, the NSTART signal is propagated through the gate delay circuit 98 prior to the time in which the RC decay on node 72 will trigger falling edge 130. The signal, SLOW, which has been turned on with rising edge 140 by falling edge 122 of START will now be driven back low by the advanced rising edge 134 at node 92 on falling edge 142 depicted in line 138 of FIG. 6. Rising edge 134 drives FET 88 on placing a logic zero signal into the input of latch 86.

Memory Core Supply Voltage and Bit Line Control Voltage for a CMOS ROM

A memory precharge voltage, VPC, is provided which tracks changes in the high supply voltage, VDD, according to a measured degree, which maintains a precharge voltage notwithstanding transient loads which may tend to draw the precharge voltage down, and which maintains the precharge voltage at the operating level notwithstanding the fact that the precharge generator is substantially turned off during a power down condition. The precharge voltage, VPC, is then used as the controlling input signal to a circuit which it generates and an internal control voltage, MLC, used to drive small pull-up current FETs coupled to the bit lines in the ROM core. The internal control signal MLC is generated to track the discharge current in a bit line within the memory core, to track VPC, and to be maintained at its operating voltage level even when the MLC current is substantially turned off during a power down condition.

The schematic of FIG. 7 illustrates a circuit 144 for generating the voltage precharge signal VPC. VPC is the output of a source follower FET 146 which has a very wide channel to supply large currents where needed to precharge the memory core after a read cycle. The channel length of FET 146 is also longer than the minimum used in the integrated circuit in order to reduce the generation of hot electrons therein. The voltage level of VPC is about 2.3 volts which is slightly higher than the voltage VRN generated at node 148, which is an internal reference voltage for NFET differential amplifier current sources used within the ROM. The voltage, VRN, is about two NFET threshold voltages as determined by the drain-to-source voltage drops across FETs 150 and 152. FETs 150 and 152 have wide channel widths and low drain current so that the drain-to-source voltage drops are only slightly higher than the threshold voltages. By this means, VRN and VPC voltage levels track the changes that occur in the NFET threshold voltages as a result of process variations, temperature variations or other variations.

Circuit 144 is designed for prevent VPC from changing appreciably as the high voltage supply, VDD, for the ROM circuit changes. A small increase of VPC with an increase of VDD can, however, improve the performance of the CMOS sense amplifiers used in the ROM. PFETs 154, 156, 158, 160 and 162 are used for this purpose. During the read cycle, the signal NCE, the logical inversion of the chip enable signal is low, which turns on NFET 156 to drive node 164 toward supply voltage, VDD. NCE, when low, switches a circuit for VDD operation. When NCE is high, most of the ROM is in a powered down state.

With the gate and drain terminals of FET 158 connected to node 166, FETs 156 and 158 supply current to node 166. As VDD increases, the current increases. The current flows through FETs 168, 170, and 172 thereby increasing the voltage on node 166 and 148 (VRN). The magnitude of the current to node 166 can be adjusted by means of FETs 160 and 162. Note that in the schematic of FIG. 7, the source and drain of FET 160 are shorted. By cutting the metal short 174, current to node 166 is reduced by. FET 160. The current can be increasing by making metal short 176. Additional current then flows through FET 162 to node 166 thereby increasing the voltage on the node.

Any increase in the voltage on node 166 results in a small increase of voltage on node 178, GVPC, and in VPC. When the voltage on node 166 increases, the voltage on nodes 180 and 182 are driven lower by FETs 184 and 186, respectively. This, in turn, reduces the drive voltage to FETs 188 and 190, respectively. The voltage on node 178, GVPC, then rises. However, because FETs 186 and 192 provide a negative feedback from node 178, GVPC, to nodes 180 and 182, the change in voltage level of GVPC is limited. An increase in the GVPC voltage at node 178 results in an increase in VPC through FET 146.

A load on the low voltage power supply, VPC, is transient in nature for a dynamic ROM. A sudden increase to the load causes VPC to drop slightly which, in turn, causes a small drop in GVPC due to the drained gate capacitance of FET 146. Inverters comprised of FETs 196, 190, 198 and 188 restore GVPC relatively quickly back to its previous level. The transient drop in GVPC reduces the drive to FETs 192 and 194. The voltage on nodes 180 and 182 then reduce to provide less drive to FETs 188 and 190. Reduction in the drain current of FETs 188 and 190 allows FETs 196 and 198 to drive GVPC back to the previous level more quickly.

To provide high gain and low power dissipation for the inverters comprised of FETs 190 and 196 on one hand and 198 and 188 on the other, a reference voltage, VRP, is coupled to the gates of FETs 196 and 198. VRP is an internal reference voltage for PFET current sources used throughout the ROM. It is the CMOS complement to the signal VRN described above. With FETs 196 and 198 functioning as constant current source loads, high gain is achieved.

The internal control voltage VRP is generated by FETs 200–204. The level of VRP is slightly more than two PFET thresholds below the high supply voltage VDD. NFET 204 has a very small drain current which flows through PFETs 200 and 202. By this means, the source to drain voltage drop across PFETs 200 and 202 is only slightly greater than the threshold voltage of a single PFET.

Another feature of the invention is the ability to power down those circuits drawing the highest current while maintaining power to the low current circuits to hold the precharge voltage VPC during standby operation. FIG. 7 includes NCE controlled FETs 156, 206 and 208. When NCE switches high for standby operation, FETs 156–162, 206, 208, 194, 184, 198 and 188 are powered down. However, FET 154 supplies a very small current to maintain a voltage on node 166 and the inverter 196,190 maintains the signal GVPC which in turn maintains VPC during standby operation. A large channel FET 210 can be used in same operations as a bypass capacitor to minimize fast transient noise voltages which might otherwise appear on VPC.

The voltage precharge circuit of FIG. 7 now having been described, turn to the minimum leakage current generator circuit 212 schematically depicted in FIG. 8. Circuit 212 generates a control signal, MLC, by a level which is slightly more than an NFET threshold voltage greater than VPC. When connected to the gate of NFETs, MLC provides a small controlled pull-up current for the bit lines to overcome negative noise voltages and leakage current to ground. As described below, the MLC circuit tracks the VPC voltage level for varying operating conditions. A current supplied by the pull-up FET to which MLC is coupled is controlled so that: (1) it is a small fraction of the current from the memory core which is discharging the bit line; and (2) it must track with operating process changes to maintain the small fraction approximately constant. Control is needed to allow the bit line to discharge properly if the selected memory core FET is programmed with a low threshold voltage. Control is also needed since current from the memory core can vary significantly with operating and process changes.

To achieve tracing with operating and process changes or to track with current from the memory core of the ROM, three series coupled FETs, 212–216 which in turn are in series with NFETs 218 and 220 to emulate the current path typically encountered in the ROM core. The gates of FETs 212–216 are each coupled to high voltage supply, VDD, similar to the coupling found in the ROM core. The current through these five series connected FETs 212–220 tracks the memory core current.

PFETs 222 and 224 form a current mirror so that current flowing in FET 218 is reflected by FET 224 and flows through FET 226 and 228. The width of FET 222 is approximately ten times that of FET 224 so that the current reflected by FET 224 is approximately ten percent of the current flowing through FET 222. PFET 230 is coupled and parallel with FET 224 and has the same channel dimensions. The total current reflected by both PFETs 224 and 230 is therefore approximately twenty percent of the current flowing through PFET 222. PFETs 232–236 are also coupled and parallel with PFET 222 and therefore reduce the amount of current reflected from FET 218 to FETs 226 and 228. With PFETs 232, 234, and 236, 222, 224, and 230 coupled to the current mirror, the reflected current flowing through FETs 226 and 228 is about thirteen percent of the current flowing through FET 218.

In order to empirically adjust the reflected current ratio for a processed silicon wafer, PFETs 230, 232, 234, 236, 238 and 240 are each provided with metal cut/short options coupled to the drain terminal and to node 244 or to node 246, the signal MLC. This provides a means whereby the optimum current ratio can be empirically set.

Circuit 212 causes the output signal at node 246, MLC, to track with VPC at its input node 248. FET 228 has its source terminal coupled to VPC and its gate to MLC. The reflected currents in PFET 224 and 230 flows through FETs 226 and 228. This drives the signal MLC above VPC slightly more than the threshold voltage of FET 228. If the VPC voltage is reduced, FETs 226 and 228 will reduce MLC accordingly. If VPC increases, PFETs 224 and 230 drive MLC higher. Metal cut/short options 250 are also included this circuit layout for FETs 252, 254 and 226. By cutting or opening the source-to-drain shorts 250 corresponding to FETs 252 or 254, the MLC voltage can be increased slightly. By shorting the source to drain of FET 226, the MLC voltage can be decreased slightly.

The output driver for the signal VPC, FET 146 in FIG. 7, is an NFET source follower which can source current, but which cannot sink any current. VPC, therefore, cannot sink the current from FET 228. Therefore, FET 256 is provided to load VPC with a current to ground which is greater than the current NFET 228. This provides a net load current from VPC to ground. The reflected current in PFET 258 is twice reflected and doubled by NFETs 260 and 256. As a result, the current through FET 256 also tracks the memory core current.

Another feature of the invention is its ability to power down the circuits while maintaining the MLC voltage during standby operation. NCE is input to node 262 in the schematic of FIG. 8 and is used to control FETs 264 and 266. The output of the inverter comprised of 264 and 266 is the node signal 268, CEDEL. When NCE switches high for the standby mode, node CEDEL is driven low by FET 226 which in turn turns off FET 220. The current flowing through FETs 218, 212, 214 and 216 is now limited by FET 270. FET 270 has a low reference voltage, VRN, coupled to its gate and has a long and narrow channel. For these reasons, the drain current through FET 270 is very low. Since the currents in PFETs 258, 224 and 230 are less than the current flowing through FET 218, the MLC circuit has a very low supply current in the standby mode. However, FETs 224 and 230 nevertheless supply a small current to maintain the MLC voltage level during standby.

The MLC voltage generated is slightly greater than one NFET threshold voltage above VPC and it tracks the VPC voltage level. The average VPC voltage can change due to variations in the number of memory read cycles per second. This results in an average loading variation on the VPC circuit which has an affect on its voltage level. MLC tracks these changes and remains slightly greater by the desired threshold amount so that it may be used throughout the circuitry in the ROM as a gate drive for small controlled pull-up devices.

An Improved NMOS Input Receiver Circuit

Turn first to the schematic diagram of FIG. 9 wherein the NMOS input receiver, generally denoted by reference numeral 272 is depicted. Receiver 272 has an input 274 for receiving, for example, an address bit, AI. Receiver 272 in turn has four output related signals, namely the output signal Q on node 276, its complement NQ on node 278 and internal output related signals S on node 280 and R on 282. As will be described below S and Q and R and NQ are largely equivalent.

When a high TTL level is input on node 274, Q goes to VCC minus VTH where VCC is the supply voltage and VTH is an NMOS threshold. When a low TTL level is detected on the input 274, the voltage on Q output 276 goes to the ground, VSS. The circuitry 284 within the dotted outline is identical to the same portion of the circuitry used in the input receiver described above in connection with co-pending application, now issued as U.S. Pat. No. 5,241,497.

The improved input receiver disclosed in the present specification has two principal improvements. One improvement is use of wide and long FET sizes to minimize manufacturing related variations.

A second improvement is the use of an isolated feedback signal S, to control the input receiver switching level. Feedback signal S is generated by inverting input, AI, on node 274 twice. Exactly how this is achieved is most easily understood by comparing the prior design, which was subject to ROM noise as shown in FIG. 10 with the schematic shown in FIG. 9.

In both cases a first inverter 288 detects a TTL voltage level and a second inverter 281 increases the amplitude and drive of the input signal. The output of second inverter 281 is fed back to first inverter 288 to avoid feedback of noise to the first inverter. In the circuitry shown in FIG. 10 and described in U.S. Pat. No. 5,241,497, the node 280, S, and node 282, R, are coupled to FET 287. This allowed the action of transistor 287 to effect switching levels through feedback through node 280, S, to the first inverter 288.

Switching noise feedback that might falsely trigger an address detection is avoided in the circuit of FIG. 9 by in effect splitting the output from second inverter 281 by coupling node 291 and the output R into the gates of FETs 285 and 283 respectively. Now any switching noise through FET 287 is well isolated from the feedback path to inverter 288 through node 280.

Consider the operation of the input receiver of FIG. 9. A TTL low level voltage is in the range of 0 to 0.8 volts while the high level voltage is in the range of VCC to about 2.4 volts. If a TTL low level is detected at node 274, output 276, Q, goes to ground. If a TTL high level is detected, then the output Q goes to VCC minus VTH. At a low level voltage detect, the TTL input at node 274, goes from high to low. Node 286 goes from low to high at the output of first inverter 288. At the same time, node 280 will go from high to low. The low voltage on node 280 is fed back and switches NFET 290 off. The switching level of first inverter 288 is raised by approximately 0.2 volts as a result as shown on curve 302 in FIG. 11.

When the input to node 274 goes to a logic high level, node 286 goes from high to low and node 280, S, goes from low to high. Node 280 is fed back to FET 290 which switches on and lowers the switching level of inverted 288 by about 0.2 volts as shown on curve 300 in FIG. 11. This lowering and raising of the input receiver switching levels is the hysteresis of the input receiver 272. A hysteresis performance of the circuit improves the noise immunity of node 274, which is the desired object.

The FETs of inverter 288 and FETs 290–298 are designed and manufactured to have a long and wide channel width to minimize manufacturing and later variations in the input receiver switching levels. The input receiver switching voltage must be between 0.8 and 2.4 volts for all conditions. Switching voltage variations plus hysteresis must always fall within this narrow voltage window. If manufacture of later variations are reduced, then hysteresis characteristics may be increased. Increased hysteresis characteristics provide better noise immunity.

The basic idea is to use an input receiver with a feedback signal to control hysteresis. An improvement of that basic idea is described here. In the case of the NMOS receiver of FIG. 9, another stage and one more output is added. Switching circuit noise from the inside of the ROM cannot now feed back into the receiver circuit and affect the detection of the TTL voltage levels. Use of wide and long FET sizes minimizes the manufacture related variations in the input receiver switching levels.

Output Driver Control for ROM and RAM Devices

The control circuits of the invention utilize a plurality of clock signals, logic gates and two latch circuits. The clock signals are used in address transition detection (ATD) circuits incorporated in the design of the memory. These ATD circuits and the clock signals are used to improve the output of the driver float control timing for memories utilizing ATD circuits.

When a ROM or RAM is switched from standby to the active operating mode, the output drivers of the memory can output old data unless the input control signal, designated here as OEPAD (output enable on the input pad) floats the output drivers during the first part of the memory read cycle. Output of the old data also increases system noise and power dissipation. Controlling the timing of the input signal, OEPAD, to float the output of the driver from the start of the read cycle until the new data is ready for output, is not a practical alternative in many prior art applications and circuit designs.

The current invention provides this timing internally and further provides timing which eliminates system data bus contention for the standby to active transition.

When a ROM or RAM read cycle is completed and a second read cycle is started, the output drivers can output the first cycle data during the first part of the second memory read cycle. If the output data does not transition smoothly from the first cycle data output to the second cycle data output, system noise and power dissipation are increased. By switching the output driver smoothly from the first output data read cycle to the second output data read cycle, system noise and power dissipation is reduced. Controlling the timing of the input signal OEPAD, to provide a smooth transition from the old data to the new data, again, is not practical in many applications. The present invention solves the problem by providing internal timing.

The circuitry of the invention can be understood first by considering the design for the output driver float control used to generate the output enable signal, OE, when a ROM or RAM is switched from standby to the active operating mode. Output enable, OE, is an internal signal generated by the circuitry of FIG. 13, which will be described in greater detail below. It controls the output drivers. When OE is high, the data output is enabled. When OE is low, the output drivers are disabled or floated.

Next, the invention is directed to a circuit used to generate the output enable signal, OE, when the RAM or ROM read cycle is followed by another read cycle. Consider first, the transition from memory standby to an active read cycle. The ROM or RAM is in standby mode when the chip enable input, CE, is used to switch the internal signal, NCE, high. CE and NCE are conventionally generated in the memory chip or provided as conventional off-chip control signals to the memory circuit. NCE is the logical invert of the chip enable, CE. When NCE is low, the circuits are switched to VDD for operation. When NCE is high, most of the memory is powered down.

Referring to FIG. 12, when NCE is high as provided to the input of NOR gate 312, the output of NOR gate 312, ENABLEOE, will be forced low. The other input to NOR gate 312 is the signal START. START is low at the beginning of a new read cycle and it switches high to start the new cycle and is generated by conventional means within the memory circuit. START is distributed to all the circuits in the memory which need to be reset to a new cycle start condition or state.

When the output of gate 312 is low, ENABLEOE, the output of the circuit of FIG. 12, enable control OECNTL is forced low by means of NAND gate 314 to which ENABLEOE is input and following inverter 316. OECNTL remains low during the standby mode. When the chip enable signal, NCE, switches low to start an active memory cycle, the control signal NREST, which is generated by logic circuitry described in FIG. 13, then switches high and gates 318 and 312 set enable OE high When enable OE is high, the input control signal OEPAD, provided at node 320 in FIG. 12, can control the output signal, OECNTL, by means of gates 314 and 316 and the logic signal OE12, output from complex gate 322. The circuitry which inputs into gate 322 will be described in greater detail below in connection with FIG. 24.

The use of the START signal as an input to gate 312 is optional. If the signal START is used, ENABLEOE is not set high when NREST switches high, but is delayed until the signal START switches low. In the schematic of FIG. 13, the application of NCE at a high level input to gate 324 resets the latch, whose output is the signal JD, low and gate 326 switches the complementary output of latch, NJD, high. Gates 324 and 326 comprise a latch which holds NJD high as long the memory is in the standby mode. The JD latch is thus a memory of the status of the last memory cycle.

Gate 328 has as its inputs the signal NJD and OECNTL from the circuit of FIG. 12. Since OECNTL is held low during the standby mode, gate 328 and inverter 330 drive the output enable signal OE, low which floats the output drivers during the standby mode.

When the chip enable input is switched to drive NCE low, the signal START switches high to begin the read cycle. The output of inverter 332 in FIG. 13 is driven low by START.

Gate 324 sets JD high and the outputs of gates 324 and 334 reset NJD low through gate 326. As long as NJD is low, it forces the output of gate 328 high which, in turn, drives the output enable signal OE, low through inverter 330. As long as NJD is low, the output enable, OE, is held low and thus does not respond to changes in the output control signal, OECNTL NJD remains low until the signal TRIG switches high resulting in gates 334 and 326 setting NJD high. When NJD goes high, OECNTL, can then determine the logic level of the output enable signal, OE, through gates 328 and inverter 330 for the remainder of the read cycle.

TRIG is a control signal from a conventional control circuit within the memory which detects when the data from the core can be latched. The TRIG circuit (not shown) has an output called TRIG which is shown as an input in FIG. 13. TRIG is low at the beginning of a read cycle and switches high to enable the circuit of FIG. 13 to: (1) latch the data and the sense amplifiers, and (2) enable the output drivers to output the data by means of the output enable signal, OE. TRIG is switched low again near the end of the read cycle by a precharge clock.

NREST is a signal generated by the circuitry shown in FIG. 13. NREST is output from an inverter 336 which in turn is derived from inverter 338 and NAND gate 340. The input to NAND gate 340 is the signal NJD and the output of inverter 342. The output inverter 342 is a signal sense latch, SLCH, which is a control signal generated in FIG. 13. SLCH is low during precharge and sensing and switched high to latch the data defined by the voltage level on the sense amplifier nodes SLQ and NSLQ. SLCH remains high until the beginning of the next memory cycle. The input to inverter 342 is derived from NOR gate 344 whose inputs are TRIG, NCE and the output of inverter 338, the control signal low precharged, SLPD.

Consider now the data control transition when the memory is in an active mode and an active read cycle is entered. The ROM or RAM is in an active mode when chip enable, CE, is used to switch the internal NCE signal low. Referring again to FIG. 12, when NCE is low, the output of latch 312, 318, ENABLEOE, remains high since it was set high by NREST at the end of the previous read. When ENABLEOE is high, the input control signal, OEPAD, at node 320, is able to control the output from inverter 316, OECNTL. Assume, for example, that OEPAD causes the output of NAND gate 322, OE12, to go high. Gates 314 and 316 then drive OECNTL high at the beginning of the second read cycle.

The NJD output of JD latch 324, 326 in FIG. 13 is high at the beginning of the second read cycle. It was switched high by TRIG near the end of the first read cycle. With both NJD and OECNTL high, the circuitry of FIG. 13 maintains the output enable, OE, high through gates 328 and 330. With output enable, OE, high at the beginning of the second read cycle, the memory still outputs the data from the first read cycle. When START switches high to begin the second read cycle, it sets JD latch 324, 326 high and NJD low through the operation of inverter 332, complex gate 324, NAND gate 334 and NAND gate 326. When NJD switches low, the circuit of FIG. 13 floats the output drivers by switching OE low through a NAND gate 328 and inverter 330 and delays switching SLCH low by means of operation of NAND gate 340, inverter 338, NOR gate 344 and inverter 342. When SLCH is low, it unlatches the sense amplifiers in a conventional manner not shown. The timing of output enable, OE, and sense latch, SLCH, ensure that transients caused by unlatching the sense amplifiers do not propagate to the output drivers before they are disabled or floated.

In summary, when NCE is low for two or more cycles, the timing of output enable, OE, during the read cycle is controlled by OEPAD and JD LATCH in the circuitry of FIG. 13. The enable OE latch in the circuitry of FIG. 12 remains set high during these read cycles and, therefore, does not effect output enable timing.

The circuit structure of the output driver control circuitry having now been described in the context of the schematics of FIGS. 12 and 13, consider the output driver float control timing in the memory in both the standby to read cycle transition and the active to read cycle transition.

First, in the standby-to-read-cycle output enable timing, when chip enable is used to switch internal NCE high at the end of the read cycle, OECNTL as described in FIG. 12 is forced low and remains low during the standby mode. Refer specifically to the timing diagram of FIG. 14. The low to high transition of the signal NCE shown on line 346 results in the signal OECNTL, depicted on line 348, switching low. The output enable signal, OE, depicted on line 350, is then driven low by means of the circuitry described in connection with FIG. 13. Output enable, OE, remains low during standby to float the output drivers.

START will cycle low when both the clock signals, PCOK and OWDN have switched high. PCOK, precharge clock OK, and OWDN, old word line discharge, are clock control signals conventionally generated in the memory circuit. If START is high at the beginning of a new read cycle, it remains high until both PCOK and OWDN have switched high. PCOK is low during core precharge then switches high when the core precharge is complete. The high level of PCOK switches a clock signal PCO to zero if the clock signal OWDN is high. If PCOK is high at the start of a memory cycle, it is switched very quickly to zero when the sample address signal, SMPA, switches high. OWDN is low during the old word line discharge and then switches high. The high level switches the precharge clock PCO, to zero if PCOK is high. If OWDN is high at the start of a memory cycle, it is switched to zero when the address sample circuit, SMPA, switches high. SMPA, in turn, is a memory control signal signifying sample address. SMPA switches high at the beginning of a memory cycle in response to any memory input address change. SMPA is high only long enough to latch the address inputs and then it is switched to low. SMPA is also used to start the memory cycle. It is used to switch PCOK and OWDN to zero as described above.

When the chip enable input results in the internal NCE signal switching low to start a read cycle, as shown by edge 352 on line 346 in FIG. 14, a sample address signal SMPA, pulse is generated such as shown on line 354. The SMPA pulse then results in the START signal switching high as shown in line 356. The high START signal causes NJD to switch low as depicted in line 358. When NJD is low, the output enable signal, OE, is held low in the circuitry of FIG. 13 and the output drivers remain in a float state independent of the value of OECNTL which is input to NAND gate 328 in FIG. 13.

When the data from the memory core is ready to latch into output, a TRIG pulse is generated by the memory TRIG circuit as depicted in line 360 in the timing diagram of FIG. 14. The TRIG pulse results in NJD switching high, followed by the output enable signal, OE, switching high as shown on line 350. When output enable, OE, switches high, the output driver is enabled to output the new data. The timing diagram of FIG. 14 illustrates a smooth transition of the output driver from float to an output drive. This is illustrated in the timing diagram of FIG. 14 by the wave forms for an output enable on line 350 for QIP on line 362, QIN on line 364, and OUT on line 366. QIP is the signal applied to the large PFET in the output driver, and QIN is the signal applied to the large NFET in the output driver. The signal OUT is the output data signal from the output driver. With QIP high and QIN low, both the PFET and NFET in the output driver are turned off and the output, OUT, is floating, which in the illustration of FIG. 14, happens to be floating high.

Note that QIP remains high for the complete cycle to keep the PFET off and minimize power dissipation. When output enable switches high on edge 368, QIN rises relatively slowly to the high logic value, VDD, to switch the NFET on and, thus, drive the signal, OUT, relatively slowly to ground, as shown respectively on lines 364 and 366 for each of these signals. The relatively slow fall time for the data output signal minimizes ground bus noise.

Consider now the operation of the float timing control as illustrated in a read-cycle-to-read-cycle transition in the timing diagram of FIG. 15. When an input address changes to the memory results in the sample address circuit generating an SMPA pulse as shown on line 370 of FIG. 15. The SMPA pulse results in a clock signal, PCOK, going low as shown on line 372. PCOK going low, in turn, causes the START signal to go high as shown on line 374. When START switches high, the JD latch in the circuitry of FIG. 13 is set high so that NJD goes low as shown on line 376. When NJD switches low, the circuit of FIG. 13 floats the output drivers which were driving the data from the previous cycle by switching output enable, OE, low as depicted on line 378. As previously stated, sense latch is then switched low after a delay through gate 340, inverter 338, gate 344 and inverter 342. When sense latch, SLCH goes low, it will unlatch the sense amplifiers. The switching of output enable before sense latch, SLCH, ensures that the transients caused by unlatching the sense amplifiers do not propagate to the output drivers before the drivers are disabled or floated. The precaution is needed to provide a smooth transition of the data output from the first to the second read cycle.

When the data from the memory core is ready to latch and to output the signal TRIG on line 380 of FIG. 15 is generated by the memory TRIG circuit. The TRIG pulse causes NJD to switch high followed by output enable switching high as shown on line 378. When output enable switches high, the output driver is enabled and the new data is output, as again indicated by the PFET and NFET gate signals on lines 382 and 384, respectively, and in the data output signal from the output driver on line 386.

Dynamic ROM Design for Read Cycle Interrupts

Currently marketed memories typically use about 20 to 30 clock signals. Usually, four of the clock signals are key or primary clocks which control other logic gates and latches to output the remaining secondary clocks to eliminate address skew errors. In the illustrated embodiment, the four primary clocks are defined as sample address, SMPA, precharge okay clock signal PCOK, old word line discharge, OWDN, and START. The schematic of FIG. 16 illustrates how these clocks are related to the START clock signal and they are generated in order to avoid address skew errors.

Consider, however, first the function to be performed by each of the clock signals in the memory. The SMPA clock switches high at the beginning of a memory cycle in response to any memory input address or chip enable change. SMPA is high only long enough to latch the address inputs and then it is switched low. SMPA is also used to start the memory read cycle. This is done by driving PCOK and OWDN clock signals to zero very quickly when SMPA impulse is high.

The PCOK clock signal is output from the PCOK circuit included within the memory. The PCOK circuit may be implemented, for example, as a one shot or single shot multivibrator. PCOK is driven low very quickly when the SMPA pulse switches high. An internal delay circuit prevents PCOK from switching high for a fixed time delay. The fixed time delay, symbolically designated here as TPCOKL is generated by the PCOK circuit in order to provide an adequate precharge time for the memory core. PCOK then switches high when the core precharge is adequate.

The fixed delay time, TPCOKL, varies significantly with changes in the supply voltage, temperature or manufacturing process variations. These changes or compensations are needed to provide adequate precharge time for the memory core. If the PCOK clock is low, and a second SMPA pulse occurs at a time less than TPCOKL, the internal delay circuit is quickly reset by the SMPA clock signal The high transition of PCOK is now extended until a time TPCOKL after a second SMPA pulse.

In summary, the PCOK clock circuit is a one shot multivibrator with an output PCOK which is reset low quickly by SMPA. After a time TPCOKL from the last SMPA pulse, PCOK will then switch high.

The OWDN clock is an output signal from an OWDN circuit shown in FIG. 16. Again, in the illustrated embodiment, the OWDN circuit is a delayed one shot multivibrator. OWDN is driven low very quickly by the SMPA pulse switching high. An internal delay circuit again prevents OWDN from switching high for a fixed delay time. The delay time of OWDN clock is defined as TOWDNL and is determined the by the OWDN circuit in order to provide an adequate discharge time for the word line in the memory core which was selected and driven high in the previous memory read cycle. Only the new selected word line can be high without causing an error in sensing the memory core. OWDN then switches high after a time TOWDNL measured after the last SMPA pulse.

Again, the fixed time delay, TOWDNL, varies with changes in the supply voltage, temperature and manufacturing process variations. Typically, these variations and the delay time are less than occur for corresponding parameter changes in TPCOKL.

If the OWDN clock signal is low, and if a second SMPA pulse occurs at a time less than the time delay, TOWDNL, the internal delay circuit is reset quickly. The high transition of OWDN is now extended until a time, TOWDNL, after the second SMPA pulse.

In summary, the OWDN circuit is a one shot multivibrator with an output OWDN which is reset low quickly by SMPA. After a time TOWDNL from the last SMPA, OWDN clock signal is set high.

Turn now to the START circuit which is schematically shown in FIG. 16. The outputs of the START circuit of FIG. 16 are the clock control signals NSTARTR output from inverter 388, START output from inverter 390 and NSTARTL output from inverter 392. Inverters 388, 392 and 390 have wide PFETs and NFETs used to drive a high fan out output and capacitance represented by the output signals NSTARTR, NSTARTL and START, respectively. Each of these outputs is routed to a different area on the layout of the chip. START controls the center of the chip, NSTARTL controls the left side and NSTARTR the right side. Both NSTARTL and NSTARTR are the logical inversion of START.

The clock signals PCOK and OWDN are provided as inputs to NAND gate 394. If either of these inputs is low, START will be switched high through the action of gate 394 and inverters 396, 398, 400 and 390. All the circuits connected to START, NSTARTL and NSTARTR are reset to begin a read cycle when START switches high. START switches high at the memory core precharge phase of the read cycle.

When both PCOK and OWDN switch high, START is driven low. This begins a second phase of the read cycle which is the memory core sensing. START remains low for the remainder of the memory read cycle.

Consider now the operation of the memory, or in the illustrated embodiment, a read only memory with read cycle interrupts. The operation below is described in eight parts. The first part is the timing of the primary clocks and some secondary clocks in an uninterrupted read cycle. The remaining five parts show the timing of these clocks with an interrupt address change. The timing of the interrupt is progressively later and the sequence is illustrated in the timing diagrams of FIGS. 17–22. The timing diagrams discussed below will illustrate how some of the dynamic ROM circuits respond to primary clocks to start a new read cycle without circuit malfunction in the new read cycle.

Consider first an uninterrupted read cycle. FIG. 17 shows three of the primary clocks and six of the secondary clocks together with the data output signal OUT. The primary clock SMPA is illustrated on line 402, START on line 404, PCOK on line 413, which are the primary clocks. The secondary clock signals are NJD illustrated on line 406, output enable, OE, illustrated on line 408, sense latch, SLCH illustrated on line 410, the reset signal, NREST, illustrated on line 412, precharge clock PCO illustrated on line 414, the trigger signal, TRIG, on line 416. The data output signal OUT, is illustrated on line 418. Each of these signals and their functions have been described above.

FIG. 17 illustrates that the SMPA pulse very quickly drives PCOK clock low. PCOK remains low for the time delay TPCOKL as illustrated on line 413. The PCOK clock controls generation of the START signal from gate 390 by the means shown in the schematic of FIG. 16. Briefly, PCOK is provided as an input to AND gate 420 whose output is coupled to an input of NOR gate 422. NOR 422 is then input into NAND gate 424 whose output is coupled to inverter 426 which is the control signal SMPA. Control signal SMPA, in turn, is input into inverter 428 into a delay circuit, generally denoted by reference numeral 430, whose output at inverter 432 is the clock signal OWDN. OWDN then is fed back to NAND gate 394, whose operation is described above, to result in the generation of START.

START switching low results in precharge clock PCO switching low to allow memory core sensing. PCO will then control other secondary clocks not shown in FIG. 17 to allow core sensing. When the data from the memory core is ready to latch an output, the control signal TRIG, shown on line 416, switches high at edge 434 and OUT switches in the illustration of FIG. 17 from high to low.

Returning to the beginning of the read memory cycle when START switches high, as illustrated in line 404, FIG. 17 illustrates another sequence of secondary clocks controlled by the primary clock START. Secondary clock NJD is switched low. As a result, OE and SLCH switch low as NREST switches high. The secondary clocks NJD, OE, SLCH and NREST are not affected later in the read memory cycle by START switching low, because NJD is output from the JD latch circuit shown in FIG. 13.

As previously described, the JD latch circuit is reset by TRIG as shown in FIG. 17 and NJD switches high. OE and SLCH then switch high and NREST switches low. Note that the logic levels of the clocks are all the same at the end of the read cycle as they were at the beginning of the read cycle.

Consider now the operation of a read cycle which is interrupted somewhat later in time when PCOK is low and START high as shown in FIG. 18. Only those lines which have a differing wave form than FIG. 18 have been renumbered as compared to the same referenced wave form lines in FIG. 17. FIG. 18 shows how the clocks respond when an interrupt occurs when PCOK or OWDN is low and START high. Line 436 of FIG. 18 illustrates a first SMPA pulse 438 and a second SMPA pulse 440. Pulse 440 resets the delay circuit and the PCOK circuit to zero. The rising edge of PCOK is thereby extended by a time TPCOKL past second SMPA pulse 440 as illustrated in line 442. Note that the secondary clock, NJD, illustrated on line 406, was not in any manner affected by the second SMPA pulse 440 because it is provided as the output of the JD latch circuit which was set high by the first START pulse. Compare line 406 of FIG. 18 with line 406 of FIG. 17.

The memory cycle is now restarted and the remaining of the memory read is exactly as described in connection with the timing diagram of FIG. 17 where no interrupts have occurred. The feature to be noted in the present invention is the use of a one shot PCOK circuit (not shown) to interface between the SMPA circuit and START circuit. The PCOK circuit provides a simple means for restarting the cycle by continuing the precharge phase of the read memory cycle with no effect on most of the clocks in the memory. Only clocks relating to the new address inputs are effected.

Consider now a read cycle which is interrupted at a later time just after the PCOK clock goes high as illustrated in the timing diagram of FIG. 19. The SMPA signal shown in line 446 shows a first SMPA pulse of 448 and a second SMPA pulse of 450 occurring just after PCOK clock illustrated on line 452 switches high. Second SMPA pulse 450 drives PCOK clock low quickly as shown on edge 454 of line 452 and START switches high in time to prevent PCO from switching low as shown by edge 456 in line 458.

Note that NJD illustrated on line 406 was not affected by second SMPA pulse 450 again because it was output from the JD latch of FIG. 13 which was set by the first START pulse. Again the remainder of the read memory cycle is exactly as shown in the timing of FIG. 17 where no interrupts occurred and, thus, each of the unaltered lines are referenced by the same numerals.

Consider now a memory read cycle which is interrupted still later just after PCO switches low as depicted in FIG. 20. The SMPA control signal shown on line 460 shows the first SMPA pulse 462 and a second SMPA pulse 464 arriving later after PCO has switched low as shown on line 466. Second SMPA pulse 464 drives PCOK quickly low as shown by edge 468 on line 470 and START high as shown on line 472. PCO on line 466 switches from low to high as illustrated by edge 474. Again note that NJD was not effected by second SMPA pulse 464 because it is provided as the output of the JD latch set by the first start pulse. Again, the remainder of the read cycle is exactly as the timing diagram shown in FIG. 17 where no interrupt occurred.

Consider now a memory read cycle which is interrupted still later just after the TRIG control signal switches high as illustrated in the timing diagram of FIG. 21. As shown on line 476 first SMPA pulse 478 is followed by an even later second SMPA pulse 480 which arrives during the time in which the TRIG control signal as illustrated on line 482 is active as indicated by pulse 484. PCOK on line 486 is quickly driven low as shown in edge 488 by second SMPA pulse 480. START on line 488 switches low which drives PCO low at edge 490 as illustrated on line 492. In addition, TRIG is switched low at edge 484 by a precharge clock switching high at about the same time that PCO switches high.

Note, however, in the this case on line 494, that NJD is effected by the second SMPA pulse 480. The JD latch was in the illustration of FIG. 21 just reset by the first TRIG pulse shown on line 482. In the illustrated embodiment, this resetting results in a narrow positive pulse 496 on line 494 for NID. START sets the JD latch in FIG. 13, putting NJD low, even though TRIG remains high for a relatively short time after START switch time and TRIG is trying to reset the JD latch at the same time.

To avoid an address skew error for this type of interrupt, the current invention employs two design features to ensure that the JD latch is set by START and not reset by TRIG. First the JD latch is designed to be set if both inputs TRIG and START are simultaneously high. Second, START is held high for a longer time than TRIG is held high. This is to ensure that the JD latch remains set after START subsequently switches low on edge 498 on line 488. The length of time that START is high is controlled by the one shot PCOK or OWDN circuit is defined as the time interval TPCOKL or TOWDNL, respectively, as illustrated by the time interval 500 on line 486. By these two means, the current invention ensures that NJD is quickly switched low to properly start a new cycle.

Corresponding pulses appear in the other secondary clocks. For example a spike 502 appears in the output enable as shown in line 504, SLCH goes high momentarily with pulse 506 as illustrated on line 508 and NREST has a negative spike 510 as shown on line 512. However, after the falling edge 498 and the second START pulse 514 shown in line 488, the read cycle continues properly in the same manner as described in connection with FIG. 17 where no interrupt occurred.

Consider now what happens when a read cycle is interrupted later yet just as the data output signal, OUT, switches. FIG. 22 is a time diagram showing on line 514 a first SMPA pulse 516 followed by a much later SMPA pulse 518 which arrives just as the data output signal as shown on line 520 is switching as depicted in edge 522. As illustrated in line 522 in FIG. 22, the result is the output driver is floated and a new read cycle is started. The output driver is floated very quickly when the secondary clock, OE, on line 524 switches low in the new cycle at edge 526. The timing of the OE clock is described in connection with the description of the circuit shown in FIGS. 12 and 13.

In summary, the clock scheme of the improved memory generates a primary START clock The relatively long pulse time of START when high is provided for setting the latches. This pulse duration is controlled by PCOK or OWDN one shot circuit. A second feature is when an address interrupt occurs early in the read cycle, while PCOK or OWDN clock is low, and START is high, these one shot circuits provide a simple means of restarting the cycle by continuing the precharge phase of the cycle with no effect on most of the secondary clocks in the memory. Only those clocks relating to the new address inputs are effected by the early interrupt. This results in less power dissipation and less bus noise.

ROM Code Mask Programmable CMOS Latch

FIG. 24 is a schematic diagram illustrating the CMOS latch devised according to the invention. The latch is comprised of PFETs 554 and 556 and NFETs 558 and 560. The gates FETs 558 and 560 are coupled to the supply voltage, GVPC By this means, nodes 562 and 564 are set at about 2.3 volts which is one threshold voltage less than GVPC. This is necessary because core FETs 566 and 568 coupled in series to FETs 558 and 560 have a relatively low source-to-drain breakdown voltage. Core FETs 566 and 568 are copies of the FETs used in the memory core.

When programming core FETs 566 and 568, one of the FETs is implanted to increase its threshold voltage to a value above GVPC so that it is not turned on when GVPC is coupled to the gate of the corresponding core FET. The other core FET is provided with less implant so that its threshold voltage is a value less than GVPC. With a lower threshold voltage, the more lightly implanted core FET can be turned on with GVPC coupled to its gate.

PFETs 554 and 556 are connected in series to FETs 558 and 560, respectively, to form a symmetrical latch as shown in FIG. 24. FIG. 25 shows an alternative or preferred embodiment of the latch with the only difference between the latch of FIG. 25 and FIG. 24 is that the gates of core FETs 566 and 568 are cross coupled in the latch of the embodiment of FIG. 25 to nodes 564 and 562, respectively.

Consider now the operation of the CMOS latch shown in FIG. 24. Assume that core FET 566 has an implanted threshold voltage less than the voltage level GVPC and that core FET 568 has an implanted threshold voltage greater than GVPC. In the power-down mode, both VDD and GVPC are at zero volts. Assume further that nodes 570, 572, 562 and 564 are also at zero volts.

When the chip is powered up, VDD rises slowly with GVPC rising slower than VDD. As VDD rises, nodes 570 and 572 start rising at an equal rate. When GVPC is increased to the threshold level voltage of core FET 566, node 562 will start to be driven downward toward ground by FET 566. Node 564 is still floating since core FET 568 has a high implanted threshold voltage than GVPC. As GVPC continues to rise, FET 558 turns on and starts driving node 570 toward ground through core FET 566. As VDD rises further, node 570 continues to be driven toward ground, PFET 556 will be turned on to drive node 572 toward VDD. Node 572 which rises towards VDD then turns off PFET 554. With PFET 554 turning off, node 570 is even more easily driven toward ground through core FET 566. This regenerative action of nodes 570 and 572 is a positive feedback which provides high gain for the latching function. By the time VDD rises to its specified voltage level the latching is completed with node 570 securely driven to ground and node 572 driven to VDD.

After the latching is completed, the only supply current drawn from VCC from the CMOS latch are the source to drain leakage currents of PFET 554 and core FET 568 for the conditions which have been assumed in this illustration. Node 572 is held to VDD by PFET 556 so that the gate to source voltage of PFET 554 is zero thereby reducing the current in PFET 554 to a minimum, or at least a negligible value. The gate to source voltage of core FET 568 is GVPC and the implanted threshold voltage of core FET 568 is greater than the voltage of GVPC. With the supply voltage GVPC coupled to the gate of core FET 568, core FET 568 may have a small subthreshold source to drain leakage current which could be greater than the leakage current of PFET 554. The supply current drawn by the latch circuit is thus approximately equal to the subthreshold drain to source current of core FET 568.

Consider now the operation of the alternative CMOS latch shown in FIG. 25 which is similar to that shown in FIG. 24. Assume in the illustrated embodiment that core FET 566 in the embodiment of FIG. 25 is then again implanted to have a threshold voltage less than the voltage GVPC in that core FET 568 similarly has an implanted threshold voltage greater than GVPC. Starting again in the power-down mode, VDD and GVPC are zero. Node 570 and 572, 562 and 564 are also assumed to be zero. Again, VDD rises slowly with GVPC rising even more slowly.

As VDD rises, nodes 570 and 572 start to rise equally. When GVPC has increased to the threshold voltage of FETs 558 and 560, nodes 562 and 564 will then start rising equally. Node 564 floats since core FET 568 has an implanted threshold voltage greater than the level of GVPC. As GVPC continues to rise, node 564 rises to the threshold voltage of core FET 566. As core FET 566 turns on, node 562 is driven toward ground which starts driving node 570 toward ground through FET 558. As VDD rises even further, with node 570 being driven toward ground, FET 556 is turned on to drive node 572 toward VDD. Node 572 rising toward VDD will turn off FET 554. With PFET 554 turning off, node 570 is more easily driven toward ground through FETs 558 and 566. This regenerative again of nodes 570 and 572 is a positive feedback which provides a high gain latching function. By the time the VDD rises to the specified voltage level the latching is completed with nodes 570 and 562 driven to ground, node 572 driven to VDD and node 564 driven by means of FET 560 and 556 to one threshold voltage below GVPC which is approximately 23 volts.

After the latching is completed, the only supply current drawn from VDD by the CMOS latch are source to drain leakage currents again of FET 554 and core FET 568 in the assumed conditions of the illustrated embodiment. Node 572 is held to VDD by FET 556 so that the gate to source voltage of FET 554 is zero thereby reducing the current of FET 554 to a minimum or negligible value. The gate-to-source voltage of core FET 568 is also zero, because node 562 is zero. The leakage current and core FET 568 is, therefore, also reduced to a negligible value. The supply current drawn from VDD by the CMOS latch of FIG. 25 is negligible and generally less than that by the latch shown in FIG. 24, thereby making is a preferred embodiment.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. The following claims are, therefore, to be read to include not only the combination of elements which are literally set forth, but all equivalent elements for performing substantially the same function in substantially the same way to obtain substantially the same result The claims are thus to be understood to include what is specifically illustrated and described above, what is conceptionally equivalent, and also what essentially incorporates the essential idea of the invention.

We claim:

1. An improvement in an input buffer circuit used for detecting a TTL voltage level at an input of said input buffer circuit, said improvement comprising:

a first inverter to detect said TTL voltage level;

a second inverter having an input coupled to an output of said first inverter, said second inverter for increasing amplitude and power of an output signal responsive to detection of said TTL voltage level, said second inverter having an output;

a feedback path coupling said output of said second inverter to said first inverter to alter hysteresis switching characteristics of said first inverter; and means for isolating said feedback loop from noise coupled to said input buffer circuit, whereby TTL voltage detection is achieved with increased noise immunity and without speed degradation or increased power consumption.

2. The improvement of claim 1 wherein said noise arises from address switching in a memory circuit, and wherein said improvement is an input address buffer for said memory circuit.

3. The improvement of claim 1 wherein said switching noise is coupled into said input buffer circuit through at least one field effect transistor having an input coupled to said input of said input buffer circuit and wherein said means for isolating said feedback loop from switching noise comprises a circuit for decoupling said one field effect transistor from said feedback path.

4. The improvement of claim 3 wherein said circuit for decoupling said one field effect transistor from said feedback path comprises a series circuit of a first and second field effect transistor, said first field effect transistor having a gate coupled to a first stage output of said second inverter, said second field effect transistor having a gate coupled to said input of said second inverter, said one field effect transistor being coupled to an output of said series circuit of said first and second field effect transistors.

5. An improvement in an input buffer circuit used for detecting a TTL voltage level at an input of said input buffer circuit, said improvement comprising:

a first inverter to detect said TTL voltage level;

a second inverter having an input coupled to an output of said first inverter, said second inverter for increasing amplitude and power of an output signal responsive to detection of said TTL voltage level, said second inverter having an output;

a feedback path coupling said output of said second inverter to said first inverter to alter hysteresis switching characteristics of said first inverter; and means for isolating said feedback loop from noise coupled to said input buffer circuit, wherein first and second inverters are NMOS inverters having wide and long FET sizes to minimize manufacturing related variations, whereby TTL voltage detection is achieved with increased noise immunity and without speed degradation or increased power consumption.

* * * * *

UNITED STATES PATENT AND TRADEMARK OFFICE
CERTIFICATE OF CORRECTION

PATENT NO.        : 6,002,618
APPLICATION NO. : 09/190040
DATED             : December 14, 1999
INVENTOR(S)       : Komarek et al.

It is certified that error appears in the above-identified patent and that said Letters Patent is hereby corrected as shown below:

Title page, item 75, inventors: delete the following names:
    Clarence W. Padgett
    Shin-Ichi Kojima
    Jack L. Minney
    Keiji Fukumura
    Hiroaki Nakanishi Signed and Sealed this Eleventh Day of September, 2007

JON W. DUDAS
*Director of the United States Patent and Trademark Office*